United States Patent
Shimizu et al.

(10) Patent No.: US 11,423,980 B2
(45) Date of Patent: Aug. 23, 2022

(54) SEMICONDUCTOR STORAGE DEVICE

(71) Applicant: KIOXIA CORPORATION, Tokyo (JP)

(72) Inventors: Yuki Shimizu, Kamakura Kanagawa (JP); Kosuke Yanagidaira, Fujisawa Kanagawa (JP)

(73) Assignee: KIOXIA CORPORATION, Tokyo (JP)

( * ) Notice: Subject to any disclaimer, the term of this patent is extended or adjusted under 35 U.S.C. 154(b) by 0 days.

(21) Appl. No.: 17/184,246

(22) Filed: Feb. 24, 2021

(65) Prior Publication Data

US 2022/0093174 A1 Mar. 24, 2022

(30) Foreign Application Priority Data

Sep. 18, 2020 (JP) .............................. JP2020-157807

(51) Int. Cl.
*G11C 16/26* (2006.01)
*G11C 11/56* (2006.01)
*G11C 16/04* (2006.01)
*H01L 27/11582* (2017.01)
*H01L 27/11556* (2017.01)

(52) U.S. Cl.
CPC ...... *G11C 11/5642* (2013.01); *G11C 11/5671* (2013.01); *G11C 16/0483* (2013.01); *G11C 16/26* (2013.01); *H01L 27/11556* (2013.01); *H01L 27/11582* (2013.01)

(58) Field of Classification Search
CPC ......... H01L 27/11556; H01L 27/11582; G11C 16/0483; G11C 16/26; G11C 11/5642; G11C 11/5671
USPC ......................................... 365/185.03, 185.21
See application file for complete search history.

(56) References Cited

U.S. PATENT DOCUMENTS

| | | | |
|---|---|---|---|
| 9,558,837 B2 * | 1/2017 | Harada | G11C 16/26 |
| 9,613,720 B2 | 4/2017 | Yamaguchi et al. | |
| 10,777,239 B2 * | 9/2020 | Sato | G11C 16/24 |
| 10,950,307 B2 * | 3/2021 | Tokiwa | G11C 16/3459 |

FOREIGN PATENT DOCUMENTS

JP 6190462 B2 8/2017

* cited by examiner

*Primary Examiner* — Son L Mai

(74) *Attorney, Agent, or Firm* — Kim & Stewart LLP

(57) ABSTRACT

A semiconductor storage device includes a first plane storing user data and system information, a second plane storing the user data and the system information, a first latch circuit storing even-numbered bit data of the system information read from the first plane, a second latch circuit storing odd-numbered bit data of the system information read from the second plane, and a sequencer. The sequencer executes in parallel a first process of reading out the even-numbered bit data of the system information from the first plane and storing the read data in the first latch circuit and a second process of reading out the odd-numbered bit data of the system information from the second plane and storing the read data in the second latch circuit.

20 Claims, 15 Drawing Sheets

SEMICONDUCTOR STORAGE DEVICE

CROSS-REFERENCE TO RELATED APPLICATION(S)

This application is based upon and claims the benefit of priority from Japanese Patent Application No. 2020-157807, filed on Sep. 18, 2020, the entire contents of which are incorporated herein by reference.

FIELD

Embodiments described herein relate generally to a semiconductor storage device.

BACKGROUND

A non-volatile memory, such as a NAND type flash memory, of a memory system executes a power-on-read operation for reading system information such as setting parameters from a predetermined memory area when the memory system is started. When the amount of data of the system information increases, the time required to read the system information increases, and thus the time required for the power-on-read operation increases.

DETAILED DESCRIPTION

Embodiments provide a semiconductor storage device that shortens the time required for a power-on-read operation.

In general, according to one embodiment, a semiconductor storage device includes a first memory cell array configured store user data and system information that is used for a write operation and a read operation on the user data, a second memory cell array configured to store the user data and the system information, a first latch circuit configured to store first bit data which are even-numbered bit data of the system information read from the first memory cell array, a second latch circuit configured to store second bit data which are odd-numbered bit data of the system information read from the second memory cell array, and a control circuit configured to execute in parallel a first process of reading the first bit data and storing the read first bit data in the first latch circuit and a second process of reading the second bit data and storing the read second bit data in the second latch circuit.

Hereinafter, embodiments will be described with reference to the drawings.

First Embodiment (Configuration of Memory System)

Figure 1:
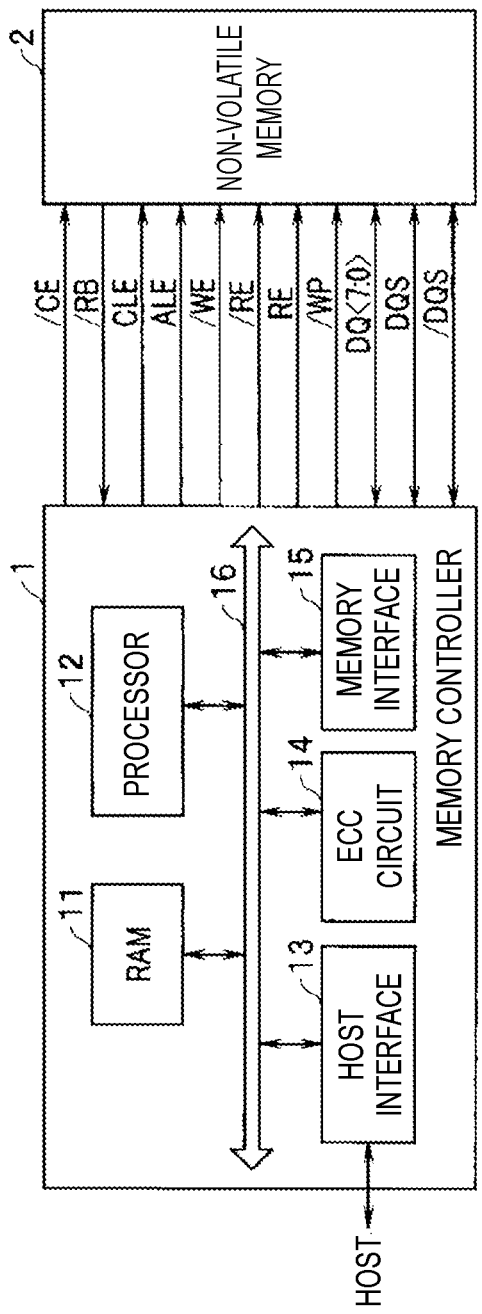
FIG. 1 a block diagram illustrating a configuration example of a memory system according to a first embodiment.

FIG. 1 is a block diagram illustrating a configuration example of a memory system according to a first embodiment. The memory system of the present embodiment includes a memory controller 1 and a non-volatile memory 2. The memory system may be connected to a host. The host is, for example, an electronic apparatus such as a personal computer or a mobile terminal.

The non-volatile memory 2 is a semiconductor storage device that stores data in a non-volatile manner, and includes, for example, a NAND flash memory. In the present embodiment, the non-volatile memory 2 is a NAND memory having memory cell transistors capable of storing 3 bits per memory cell transistor, that is, a 3-bits/cell (TLC: Triple Level Cell) NAND memory. The non-volatile memory 2 has a three-dimensional structure.

Further, the non-volatile memory 2 may be a NAND memory having memory cell transistors capable of storing 2 bits per memory cell transistor, that is, a 2-bit/cell (MLC: Multi Level Cell) NAND memory, or a NAND memory having memory cell transistors capable of storing 4 bits per memory cell transistor, that is, a 4-bit/cell (QLC: Quad Level Cell) NAND memory.

The non-volatile memory 2 may be a NAND memory having memory cell transistors capable of storing 1 bit per memory cell transistor, that is, a 1-bit/cell (SLC: Single Level Cell) NAND memory.

The memory controller 1 controls writing of data in the non-volatile memory 2 according to a write request from the host. Further, the memory controller 1 controls reading of data from the non-volatile memory 2 according to a read request from the host. The memory controller 1 includes a RAM (Random Access Memory) 11, a processor 12, a host interface 13, an ECC (Error Checking and Correction) circuit 14, and a memory interface 15. The RAM 11, the processor 12, the host interface 13, the ECC circuit 14, and the memory interface 15 are interconnected by an internal bus 16.

The host interface 13 outputs a request received from the host and user data (write data) to the internal bus 16. Further, the host interface 13 transmits user data read from the non-volatile memory 2 and a response from the processor 12 to the host.

The memory interface 15 controls the process of writing user data in the non-volatile memory 2 and the process of reading user data from the non-volatile memory 2 based on an instruction of the processor 12.

The processor 12 controls the memory controller 1. The processor 12 is, for example, a CPU (Central Processing Unit) or an MPU (Micro Processing Unit). Upon receiving a request from the host via the host interface 13, the processor 12 performs a control according to the request. For example, the processor 12 instructs the memory interface 15 to write user data and parity in the non-volatile memory 2 according to the request from the host. Further, the processor 12 instructs the memory interface 15 to read user data and parity from the non-volatile memory 2 according to the request from the host.

The processor 12 determines a storage area (hereinafter, referred to as a memory area) on the non-volatile memory 2 with respect to user data stored in the RAM 11. The user data are stored in the RAM 11 via the internal bus 16. The processor 12 determines the memory area for the page-based data (or more simply "page data"), which is a unit of writing. In the present disclosure, user data stored in one page of the non-volatile memory 2 are referred to as unit data. The unit data are, for example, encoded and stored as a code word in the non-volatile memory 2.

The encoding is not essential. The memory controller 1 may store the unit data in the non-volatile memory 2 without encoding the unit data, but FIG. 1 illustrates a configuration example in which the encoding is performed. When the memory controller 1 does not perform the encoding, the page data matches the unit data. Further, a single code word may be generated based on one piece of unit data, or a single code word may be generated based on a portion of unit data. Further, a single code word may be generated by using plural pieces of unit data.

The processor 12 determines the memory area of the non-volatile memory 2 of a write destination for each unit data. A physical address is assigned to the memory area of the non-volatile memory 2. The processor 12 manages the memory area of the write destination of the unit data by using the physical address. The processor 12 designates the physical address of the determined memory area and instructs the memory interface 15 to write the user data in the non-volatile memory 2. The processor 12 manages the correspondence between a logical address of the user data (a logical address managed by the host) and the physical address. When receiving a read request including the logical address from the host, the processor 12 determines the physical address corresponding to the logical address, designates the physical address, and instructs the memory interface 15 to read the user data.

The ECC circuit 14 encodes the user data stored in the RAM 11 to generate a code word. Further, the ECC circuit 14 decodes the code word read from the non-volatile memory 2.

The RAM 11 temporarily stores the user data received from the host until the user data are stored in the non-volatile memory 2, or temporarily stores the data read from the non-volatile memory 2 until the data are transmitted to the host. The RAM 11 is, for example, a general-purpose memory such as a SRAM (Static Random Access Memory) or a DRAM (Dynamic Random Access Memory).

FIG. 1 illustrates a configuration example in which the memory controller 1 includes the ECC circuit 14 and the memory interface 15. However, the ECC circuit 14 may be built into the memory interface 15. Further, the ECC circuit 14 may be built in the non-volatile memory 2.

When receiving the write request from the host, the memory controller 1 operates as follows. The processor 12 temporarily stores write data in the RAM 11. The processor 12 reads the data stored in the RAM 11 and inputs the read data to the ECC circuit 14. The ECC circuit 14 encodes the input data and transmits the code word, which is the encoded input data, to the memory interface 15. The memory interface 15 writes the code word in the non-volatile memory 2.

When receiving the read request from the host, the memory controller 1 operates as follows. The memory interface 15 transmits the code word, which is read from the non-volatile memory 2, to the ECC circuit 14. The ECC circuit 14 decodes the code word and stores the decoded data in the RAM 11. The processor 12 transmits the data stored in the RAM 11 to the host via the host interface 13.

(Configuration of Non-Volatile Memory)

Figure 2:
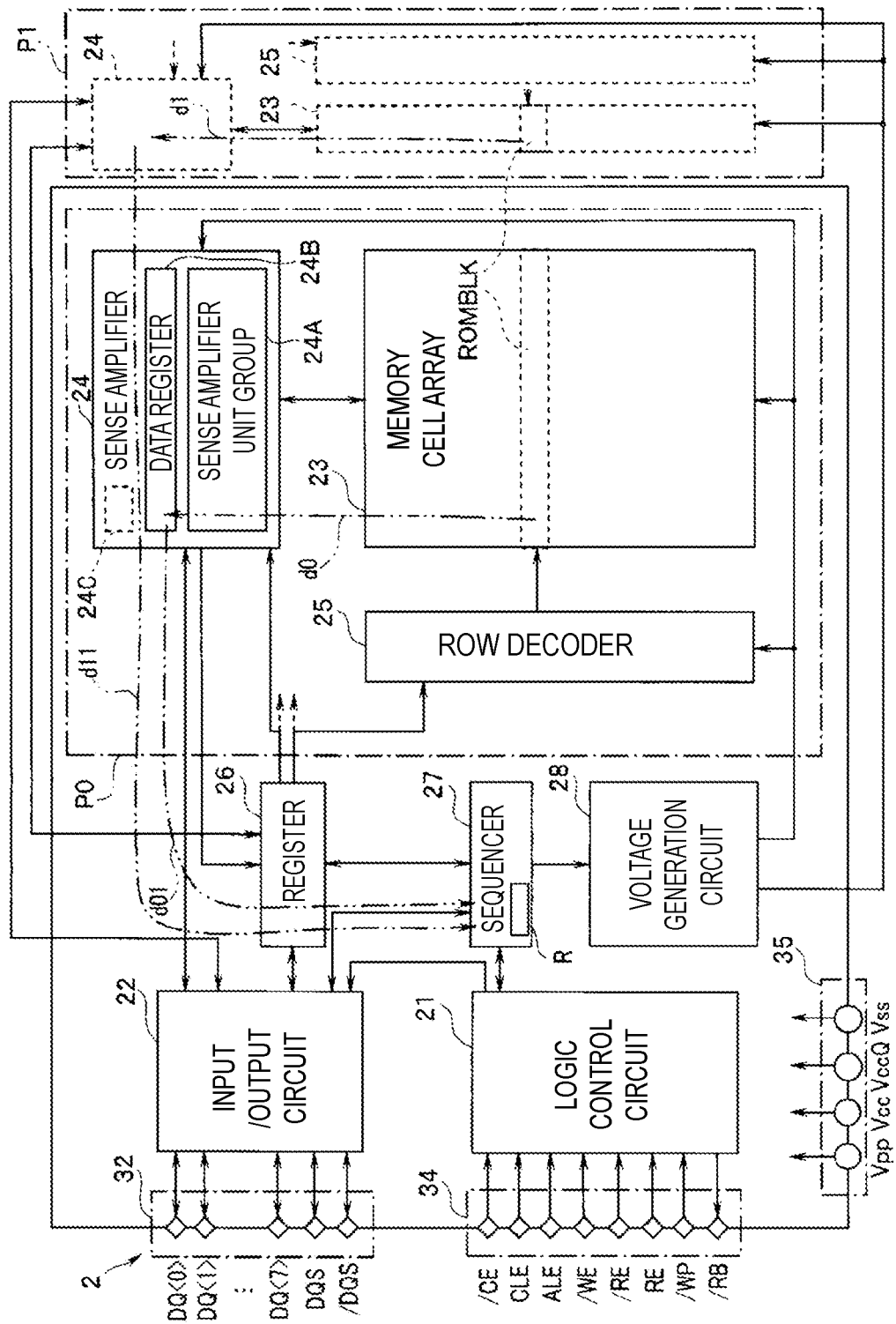
FIG. 2 is a block diagram illustrating a configuration example of a non-volatile memory according to the first embodiment.

FIG. 2 is a block diagram illustrating a configuration example of the non-volatile memory of the present embodiment. The non-volatile memory 2 includes a logic control circuit 21, an input/output circuit 22, two memory cell arrays 23, two sense amplifiers 24, two row decoders 25, a register circuit 26, a sequencer 27, a voltage generation circuit 28, an input/output pad group 32, a logic control pad group 34, and a power input terminal group 35.

The non-volatile memory 2 is a NAND memory having two planes P0 and P1. Each of the planes P0 and P1 includes the memory cell array 23, the sense amplifier 24, and the row decoder 25. Each of the planes P0 and P1 is a unit capable of independently executing a read operation, a write operation, and an erase operation.

The memory cell array 23 includes a plurality of blocks. The memory cell array 23 may store user data and system information SI. Each of the plurality of blocks BLK includes a plurality of memory cell transistors (also referred to as memory cells). A plurality of bit lines, a plurality of word lines, a source line, and the like are arranged in the memory cell array 23 in order to control a voltage applied to each of the memory cell transistors. The specific configuration of the blocks BLK will be described later.

The input/output pad group 32 includes a plurality of terminals (e.g., pads) corresponding to a signal DQ<7:0> and data strobe signals DQS and /DQS in order to exchange each signal including data with the memory controller 1.

The logic control pad group 34 includes a plurality of terminals (e.g., pads) corresponding to a chip enable signal /CE, a command latch enable signal CLE, an address latch enable signal ALE, a write enable signal /WE, read enable signals RE and /RE, and a write protect signal /WP in order to exchange each signal between the memory controller 1.

The signal /CE enables selection of the non-volatile memory 2. The signal CLE enables a command transmitted as the signal DQ to be latched into a command register. The signal ALE enables an address transmitted as the signal DQ to be latched into an address register. A signal WE enables writing. The signal RE enables reading. A signal WP prohibits writing and erasing. A signal R/B indicates whether the non-volatile memory 2 is in a ready state (a state in which an external instruction may be accepted) or in a busy state (a state in which an external instruction may not be accepted). The memory controller 1 may know the state of the non-volatile memory 2 by receiving the signal R/B.

The power input terminal group 35 includes a plurality of terminals to which power source voltages Vcc, VccQ, and Vpp and a ground voltage Vss are input in order to supply various operation voltages to the non-volatile memory 2 from the outside. The power source voltage Vcc is a circuit power source voltage, for example, a voltage of about 3.3V, which is generally given from the outside as the operation voltage. The power source voltage VccQ is, for example, a voltage of 1.2V. The power source voltage VccQ is used to exchange a signal between the memory controller 1 and the non-volatile memory 2. The power source voltage Vpp is a power source voltage, for example, a voltage of 12V, which is higher than the power source voltage Vcc.

The logic control circuit 21 and the input/output circuit 22 are connected to the memory controller 1 via a NAND bus. The input/output circuit 22 exchanges the signal DQ (e.g., DQ0 to DQ7) with the memory controller 1 via the NAND bus.

The logic control circuit 21 receives external control signals (e.g., the chip enable signal /CE, the command latch enable signal CLE, the address latch enable signal ALE, the write enable signal /WE, the read enable signals RE and /RE, and the write protect signal /WP) from the memory controller 1 via the NAND bus. The symbol "/" added to the signal name indicates that the signal is active when low. Further, the logic control circuit 21 transmits a ready/busy signal /RB to the memory controller 1 via the NAND bus.

The register circuit 26 includes a command register, an address register, and a status register. The command register temporarily stores commands. The address register temporarily stores addresses. The status register temporarily stores status data relating to the operation of the non-volatile memory 2. The register circuit 26 includes, for example, a SRAM.

The sequencer 27 is a control circuit that receives a command from the register circuit 26 and controls the non-volatile memory 2 according to a sequence based on this command. The sequencer 27 includes a register R.

The voltage generation circuit 28 receives a power source voltage from the outside of the non-volatile memory 2 and uses this power source voltage to generate a plurality of voltages required for the write operation, the read operation, and the erase operation. The voltage generation circuit 28 supplies the generated voltages to the two memory cell arrays 23, the two sense amplifiers 24, and the two row decoders 25.

The row decoder 25 of each of the planes P0 and P1 receives a row address from the register circuit 26 and decodes this row address. The row decoder 25 performs a word line selection operation based on the decoded row address. Then, the row decoder 25 transfers a plurality of voltages required for the write operation, the read operation, and the erase operation to a selected block.

The sense amplifier 24 of each of the planes P0 and P1 receives a column address from the register circuit 26 and decodes this column address. The sense amplifier 24 selects one of the bit lines based on the decoded column address. Further, when data are read out, the sense amplifier 24 detects and amplifies data read from the memory cell transistor into the bit line. Further, when data are written in, the sense amplifier 24 transfers write data in the bit line into the memory cell transistor.

The sense amplifier 24 has a sense amplifier unit group 24A and a data register 24B. The data register 24B is a latch circuit XDL in the sense amplifier unit group 24A that temporarily stores the data detected by the sense amplifier 24 when the data are read out, and serially transfers the data to the input/output circuit 22. Further, the data register 24B temporarily stores the data serially transferred from the input/output circuit 22 when data are written in, and transfers the data to the sense amplifier 24. The data register 24B includes, for example, a SRAM.

(Configuration of Memory Cell Array)

Figure 3:
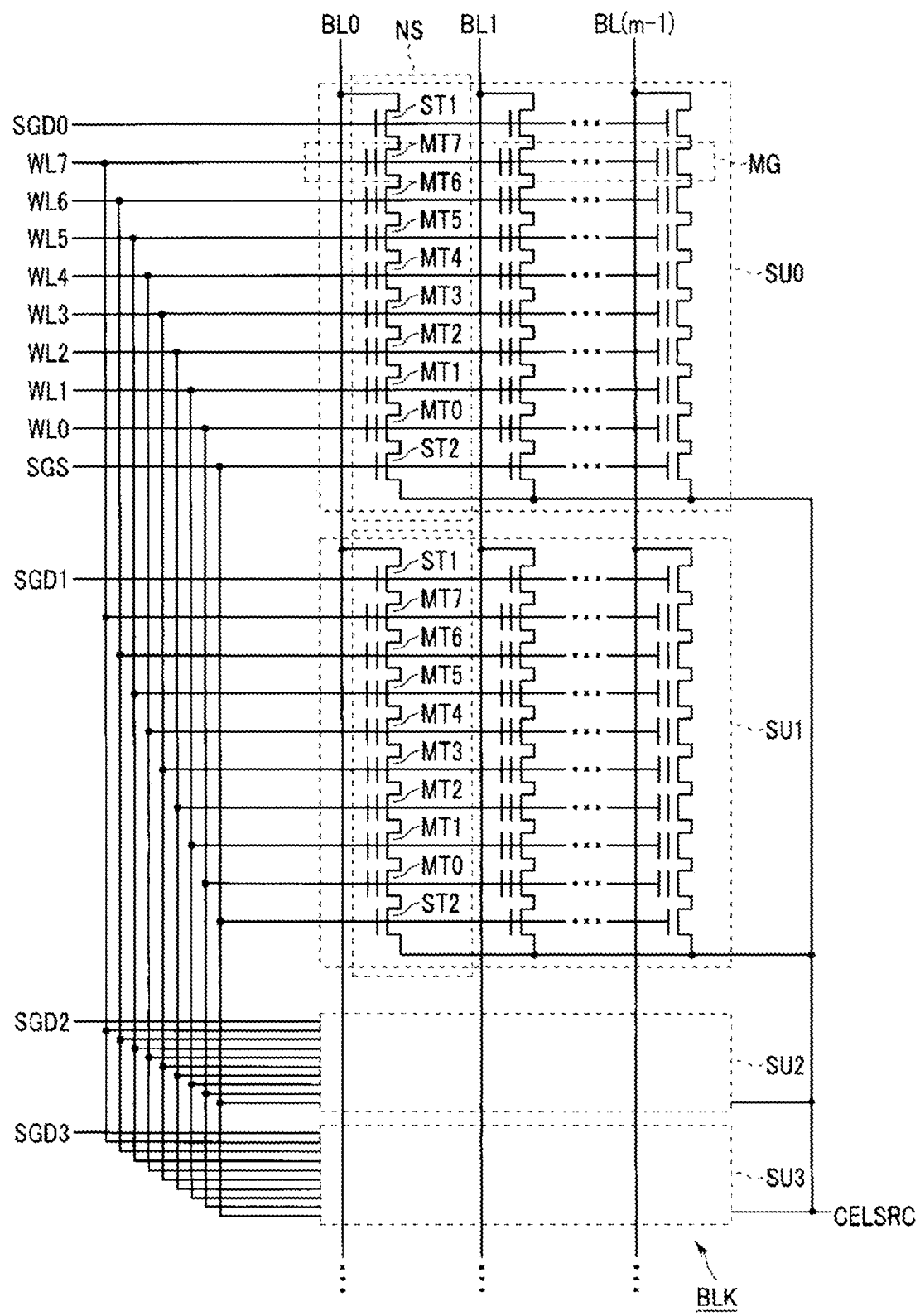
FIG. 3 is a diagram illustrating a circuit configuration example of a block of a three-dimensional structure NAND memory according to the first embodiment.
Figure 4:
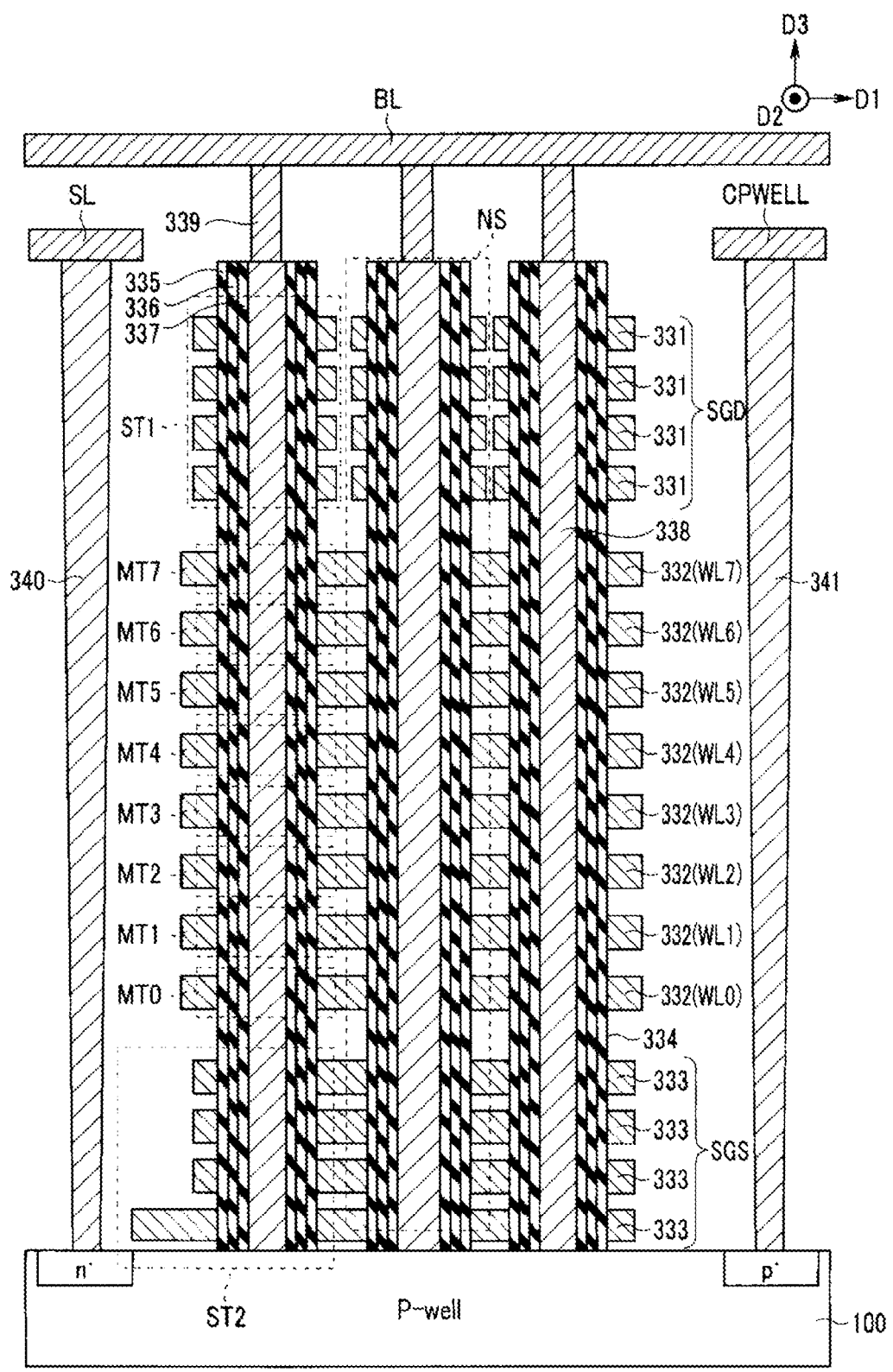
FIG. 4 is a cross-sectional view of the block of the three-dimensional structure NAND memory according to the first embodiment.

The memory cell array 23 of the three-dimensional structure NAND memory includes a plurality of blocks. FIG. 3 is a diagram illustrating a circuit configuration example of a block of the three-dimensional structure NAND memory. FIG. 4 is a cross-sectional view of the block of the three-dimensional NAND memory. The other blocks of the memory cell array 23 also have the same circuit configuration as in FIG. 3 and the same cross-sectional structure as in FIG. 4.

As illustrated in FIG. 3, the block BLK includes, for example, four string units SU (SU0 to SU3). Further, each of the string units SU includes a plurality of NAND strings NS. Each of the NAND strings NS includes, for example, eight memory cell transistors MT (MT0 to MT7) and select gate transistors ST1 and ST2. Each of the memory cell transistors MT includes a gate and a charge storage layer and stores data in a non-volatile manner.

The number of memory cell transistors MT is not limited to 8 and may be, for example, 32, 48, 64, or 96. Although the select gate transistors ST1 and ST2 are illustrated as a transistor on an electric circuit, they may be structurally the same as the memory cell transistors. Further, for example, in order to improve the cutoff characteristic, a plurality of select gate transistors may be used as the select gate transistors ST1 and ST2, respectively. Further, dummy cell transistors may be provided at a place where the continuity of the memory cell transistors MT ends, such as between the memory cell transistors MT and the select gate transistors ST1 and ST2.

The memory cell transistors MT are connected in series between the select gate transistors ST1 and ST2. The memory cell transistor MT7 on one end side is connected to one end of the select gate transistor ST1, and the memory cell transistor MT0 on the other end side is connected to one end of the select gate transistor ST2.

The gates of the select gate transistors ST1 of the string units SU0 to SU3 are connected in common to selected gate lines SGD0 to SGD3, respectively. Meanwhile, the gates of the select gate transistors ST2 are connected in common to the same selected gate line SGS across the plurality of string units SU in the same block BLK. Further, control gates of the memory cell transistors MT0 to MT7 in the same block BLK are connected in common to word lines WL0 to WL7, respectively. That is, the word lines WL0 to WL7 and the selected gate line SGS are connected in common across the plurality of string units SU0 to SU3 in the same block BLK, whereas the selected gate lines SGD are independent for each of the string units SU0 to SU3 even in the same block BLK.

The word lines WL0 to WL7 are connected to the control gate electrodes of the memory cell transistors MT0 to MT7 that make up the NAND string NS, respectively, and the memory cell transistors MTi (i=0 to n) in each NAND string NS are connected in common by the same word line WLi (i=0 to n). That is, the control gate electrode of the memory cell transistor MTi corresponding to each of the NAND strings NS in the block BLK (having the same height in the D3 direction in FIG. 3) is connected to the same word line WLi. In the following description, the NAND string NS may be simply referred to as a "string".

The other end of the select gate transistor ST1 of the NAND string NS (the end on the side not connected to the memory cell transistor MT7) is connected to one of m bit lines. The bit line BL is connected in common to one NAND string NS in each the string units SU0 to SU3 in the same block BLK. Further, the bit line BL is connected in common to the corresponding NAND string NS across a plurality of blocks BLK. Further, the other end of the select gate transistor ST2 (the end on the side not connected to the memory cell transistor MT0) is connected to a source line CELSRC. The source line CELSRC is connected in common to a plurality of NAND strings NS across a plurality of blocks BLK.

As described above, the data of the memory cells (the memory cell transistors MT) in the same block BLK are erased all at once. Meanwhile, the data read and write are performed in the unit of memory cell group MG (or the unit of page). In the present disclosure, a plurality of memory cells connected to a single word line WLi and belonging to a single string unit SU are defined as a memory cell group MG. At the time of read operation and write operation, according to a physical address, a single word line WLi and a single selected gate line SGD are selected and a memory cell group MG is selected.

Each of the planes P0 and P1 includes a user data area and a ROM (Read Only Memory) area. The user data area may store user data and may be accessed by a user of the memory system. The ROM area may store system information SI and is generally not accessed by a user of the memory system.

As illustrated in FIG. 2, a portion of the memory cell array 23 of each of the planes P0 and P1 is used as a ROM area. Here, the ROM area is a memory area of at least a portion of one block BLK among the plurality of block BLKs in the memory cell array 23. Hereinafter, a block BLK having a ROM area is referred to as a ROM block ROMBLK. In each of the planes P0 and P1, two or more blocks BLK may be used as a ROM area. That is, each of the planes P0 and P1 may include two or more ROM blocks ROMBLK.

The ROM area stores, for example, system information required for the non-volatile memory 2 to operate. The system information is, for example, information used for controlling the write operation and the read operation on user data. The system information required for the non-volatile memory 2 to operate includes various setting parameters, for example, defective block (i.e., unusable block) information, timing information, column redundancy information, and trimming information. The trimming information is, for example, a parameter for generating a predetermined voltage.

The non-volatile memory 2 is evaluated after being manufactured, and the defective block information, the column redundancy information, and the trimming information are stored in the ROM area as system information. The system information SI is transmitted from the non-volatile memory 2 to the memory controller 1 and stored in the RAM 11.

Power-on read is a read operation for reading out the system information SI from the ROM area, which is executed after the memory system or the non-volatile memory 2 is started. The power-on read is, for example, a data read operation performed first after the memory system is started. The non-volatile memory 2 uses the system information read from the ROM area by the power-on read to control the write operation and the read operation on the user data.

That is, the system information required for the non-volatile memory 2 to operate is written in advance in the ROM block ROMBLK. By the power-on read, the system information is read from the ROM block ROMBLK.

In FIG. 4, the D1 direction corresponds to a direction in which the bit line BL extends, the D2 direction corresponds to a direction in which the word line WL and the selected gate lines SGD and SGS extend, and the D3 direction corresponds to a direction in which the word line WL and the selected gate lines SGD and SGS are stacked. Further, the D1 direction is parallel to the surface of a semiconductor substrate 100, the D2 direction is parallel to the surface of the semiconductor substrate 100 and orthogonal to the D1 direction, and the D3 direction is perpendicular to the surface of the semiconductor substrate 100 and orthogonal to the D1 direction and the D2 direction.

As illustrated in FIG. 4, a plurality of NAND strings NS are formed on a p-type well region (P-well). That is, a plurality of wiring layers 333 functioning as the selected gate line SGS, a plurality of wiring layers 332 functioning as the word line WLi, and a plurality of wiring layers 331 functioning as the selected gate line SGD are stacked on the p-type well region.

Then, a memory hole 334 that penetrates these wiring layers 333, 332, and 331 and reaches the p-type well region is formed. A block insulating film 335, a charge storage layer 336, and a gate insulating film 337 are sequentially formed on the side surface of the memory hole 334, and a conductor column 338 is further embedded in the memory hole 334. The conductor column 338 is made of, for example, polysilicon and functions as a region where a channel is formed at the time of operation of the memory cell transistors MT and the select gate transistors ST1 and ST2 in the NAND string NS.

In each of the NAND strings NS, the select gate transistor ST2, the plurality of memory cell transistors MT, and the select gate transistor ST1 are formed on the p-type well region. A wiring layer functioning as the bit line BL is formed above the conductor column 338. A contact plug 339 that connects the conductor column 338 and the bit line BL is formed on the conductor column 338.

Further, an n+ type impurity diffusion layer and a p+ type impurity diffusion layer are formed in the surface of the p-type well region. A contact plug 340 is formed on the n+ type impurity diffusion layer, and a wiring layer functioning as the source line SL is formed on the contact plug 340. Further, a contact plug 341 is formed on the p+ type impurity diffusion layer, and a wiring layer functioning as a well line CPWELL is formed on the contact plug 341.

A plurality of configurations illustrated in FIG. 4 is arranged in the depth direction (D2 direction) of the paper surface of FIG. 4, and a single string unit SU includes a set of plurality of NAND strings arranged in a row in the depth direction.

Figure 5:
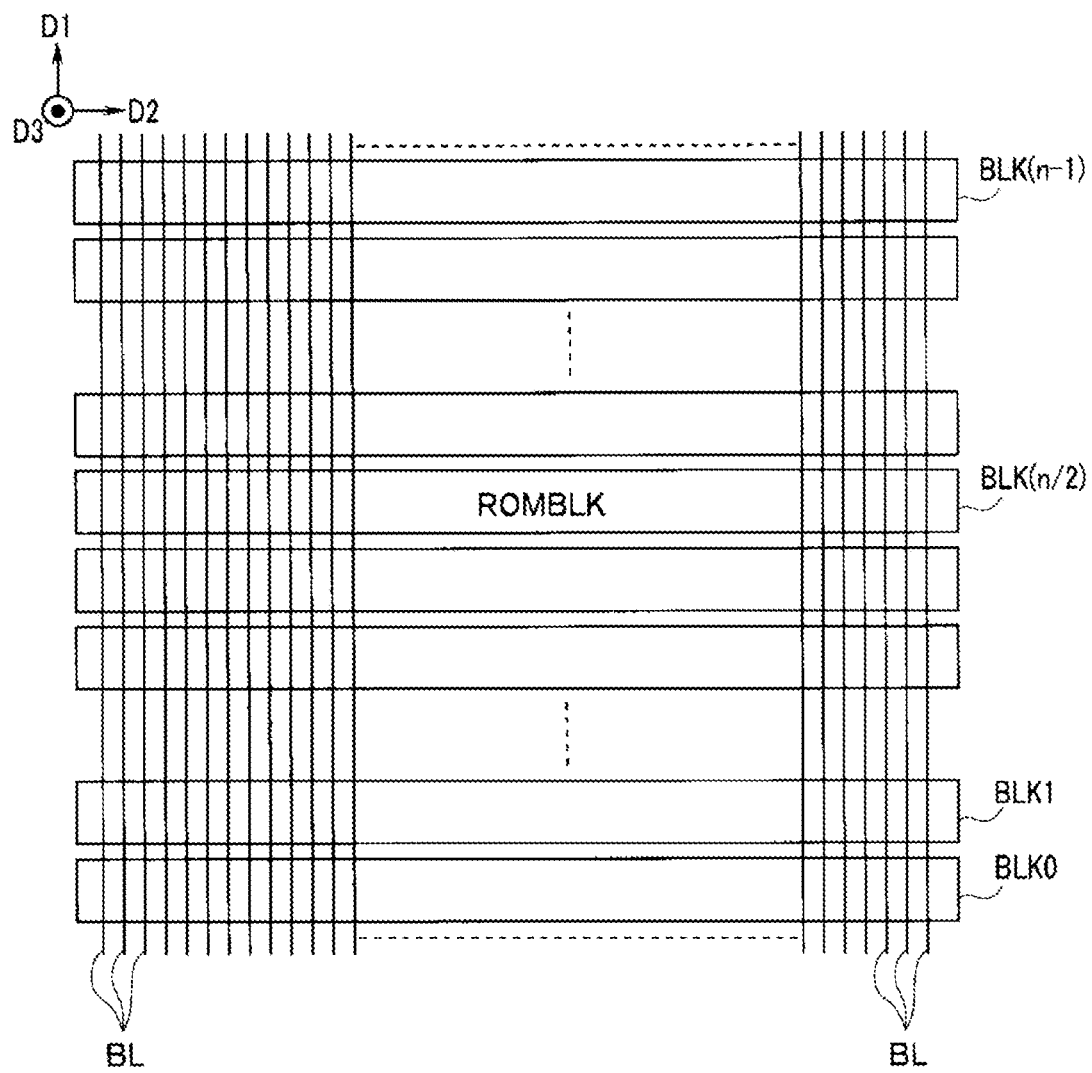
FIG. 5 is a plan view illustrating the arrangement of blocks in a memory cell array according to the first embodiment.

FIG. 5 is a diagram illustrating the arrangement of blocks in the memory cell array 23 in a plan view from the side of a plurality of bit lines BL.

When the memory cell array 23 is viewed from the D3 direction, a plurality of bit lines BL is arranged in parallel with each other. A plurality of blocks BLK is provided in the direction in which the bit lines BL extend. Each of the blocks BLK extends in the direction orthogonal to the bit lines BL.

Here, the memory cell array 23 of each of the planes P0 and P1 has n blocks BLK.

The ROM block ROMBLK is a block substantially in the middle of a plurality of blocks BLK arranged in the D1 direction. In FIG. 5, the block BLK(n/2) substantially in the middle of the blocks BLK0 to BLK(n−1) arranged in the D1 direction, is the ROM block ROMBLK having a ROM area.

For example, when n is 2,000, it is the block BLK0 to the block BLK1999, and the ROM block ROMBLK is the 1000th block BLK1000.

(Threshold Voltage Distribution of Memory Cell Transistors)

The write operation of data in the memory cell transistor MT includes a program operation and a verification operation. The program operation refers to an operation of increasing the threshold voltage Vth of the memory cell transistor MT by injecting electrons into the charge storage layer 336 (or maintaining the threshold voltage Vth by prohibiting the injection). During the program operation, the sequencer 27 controls the row decoder 25 to apply a program voltage Vpgm to the word line WL connected to the target memory cell transistor MT, and controls the sense amplifier 24 to apply a bit line voltage corresponding to data to be written, to the bit line BL connected to the target memory cell transistor MT.

Figure 6:
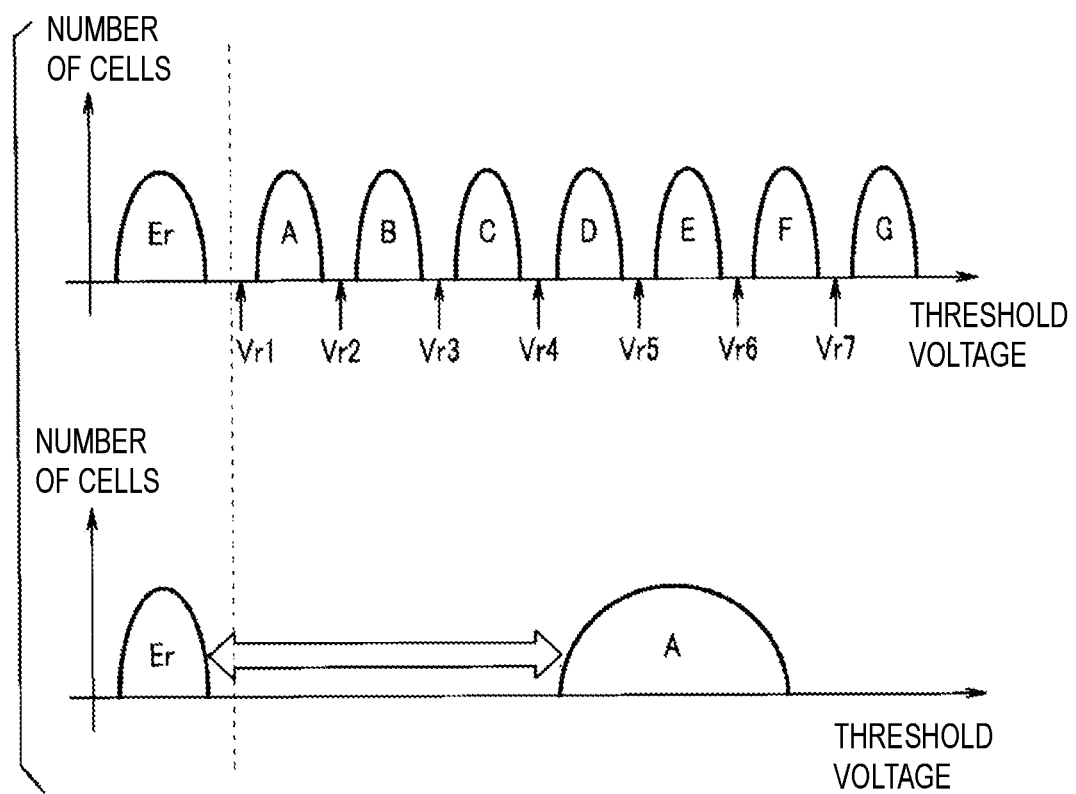
FIG. 6 is a diagram illustrating an example of threshold voltage distributions of the first embodiment.

FIG. 6 is a diagram illustrating an example of threshold voltage distributions of the present embodiment. The upper figure of FIG. 6 illustrates an example of threshold voltage distributions of a 3-bit/cell memory cell transistor MT. Information is stored in the non-volatile memory 2 according to the amount of charges stored in a charge storage film of memory cells. Each memory cell has a threshold voltage Vth according to the amount of charges. Then, a plurality of data values stored in the memory cell is associated with a plurality of regions of the threshold voltage Vth (threshold voltage regions), respectively.

In the upper figure of FIG. 6, eight (lobe-shaped) distributions corresponding to Er, A, B, C, D, E, F, and G states, indicate the respective threshold voltage distributions within eight threshold voltage regions. In this way, the 3-bit/cell memory cell transistor MT has threshold voltage distributions partitioned by seven boundaries. In FIG. 6, the horizontal axis represents the threshold voltage Vth, and the vertical axis represents the number of memory cells.

In the present embodiment, a region where the threshold voltage Vth is equal to or lower than Vr1 corresponds to the Er state, a region where the threshold voltage Vth is higher than Vr1 and equal to or lower than Vr2 corresponds to the A state, a region where the threshold voltage Vth is higher than Vr2 and equal to or lower than Vr3 corresponds to the B state, and a region where the threshold voltage Vth is higher than Vr3 and equal to or lower than Vr4 corresponds to the C state. Further, in the present embodiment, a region where the threshold voltage Vth is higher than Vr4 and equal to or lower than Vr5 corresponds to the D state, a region where the threshold voltage Vth is higher than Vr5 and equal to or lower than Vr6 corresponds to the E state, a region where the threshold voltage Vth is higher than Vr6 and equal to or lower than Vr7 corresponds to the F state, and a region where the threshold voltage Vth is higher than Vr7 corresponds to the G state.

In addition, the threshold voltage distributions corresponding to the Er, A, B, C, D, E, F, and G states are called first to eighth threshold voltage distributions, respectively. Vr1 to Vr7 are the threshold voltages Vth that are the boundaries of the respective states.

The lower figure of FIG. 6 illustrates an example of threshold voltage distributions of a 1-bit/cell memory cell transistor MT. In the lower figure of FIG. 6, two (lobe-shaped) distributions corresponding to Er and A states, indicate the respective threshold voltage distributions of these two states. In this way, the 1-bit/cell memory cell transistor MT has threshold voltage distributions separated by one boundary.

In the non-volatile memory 2, a plurality of data values is associated with a plurality of threshold voltage distributions of the memory cell, respectively. This association is referred to as data coding. This data coding is defined in advance, and at the time of data write (program), charges are injected into the memory cell to be within a threshold voltage distribution according to a data value to be stored. Then, at the time of data read, a read voltage is applied to the memory cell to determine the data depending on whether the threshold voltage of the memory cell is lower or higher than the read voltage.

The non-volatile memory 2 has, for example, two operation modes, that is, a first mode and a second mode. The first mode is, for example, a TLC mode that is applied when the memory cell transistor MT stores 3-bit data, and the second mode is an SLC mode that is applied when the memory cell transistor MT stores 1-bit data.

For example, in the user data area of each of the planes P0 and P1, the memory cell transistor MT has a threshold voltage distribution of 3-bit/cell. The write operation of data in the user data area of each of the planes P0 and P1 and the read operation of data from the user data area are executed in the first mode. In the user data area of each of the planes P0 and P1, the memory cell transistor MT may have a threshold voltage distribution of 4-bit/cell, 3-bit/cell, 2-bit/cell, 1-bit/cell, or a combination thereof.

For example, in the ROM area of each of the planes P0 and P1, the memory cell transistor MT has a threshold voltage distribution of 1-bit/cell. The write operation of data in the ROM area of each of the planes P0 and P1 and the read operation of data from the ROM area are executed in the second mode. In the ROM area of each of the planes P0 and P1, the memory cell transistor MT may have a threshold voltage distribution of 4-bit/cell, 3-bit/cell, 2-bit/cell, 1-bit/cell, or a combination thereof. However, the ROM area is required to have higher reliability than the user data area. Therefore, it is preferable to use a 1-bit/cell memory cell transistor MT or a 2-bit/cell memory cell transistor MT.

In the second mode, as illustrated in the lower figure of FIG. 6, the number of threshold voltage distributions is one, and binary data of 0 or 1 is stored in each memory cell transistor MT.

(Sense Amplifier)

In the non-volatile memory 2, the sense amplifier 24 is used when writing data in the memory cell transistor MT and reading data from the memory cell transistor MT.

In the non-volatile memory 2, the read of data from the memory cell transistor MT is performed by either a current sense method or a voltage sense method. The current sense method is a method of sensing a current flowing through the bit line BL. The voltage sense method is a method of sensing a voltage fluctuation of the bit line BL.

In the current sense method, for example, for a high-speed operation, data are read out in the sense amplifier 24 for all bit lines BL of a selected word line WL. In the voltage sense method, for example, in order to ensure the read accuracy, data are separately read out in the sense amplifier 24 for the even-numbered bit lines BLe and the odd-numbered bit lines BLo among all the bit lines BL of a selected word line WL. Further, even in the current sense method, the sense amplifier 24 may read out separately for the even-numbered bit lines BLe and the odd-numbered bit lines BLo.

For example, in the above-mentioned first mode, the read of data from the memory cell transistor MT in the user data area is performed by the current sense method. Further, for example, in the above-mentioned second mode, the read of data from the memory cell transistor MT in the ROM area is performed by the voltage sense method. Further, the data read in the first mode may be performed by the voltage sense method, or the data read in the second mode may be performed by the current sense method. However, the data read of the first mode performed on the user data area is required to be performed at a high speed. Therefore, it is preferable that the data read of the first mode performed on the user data area is performed by the current sense method. Further, the data read of the second mode performed on the ROM area is required to have higher reliability than the data read of the first mode performed on the user data area. Therefore, it is preferable that the data read of the second mode performed on the ROM area is performed by the voltage sense method.

Figure 7:
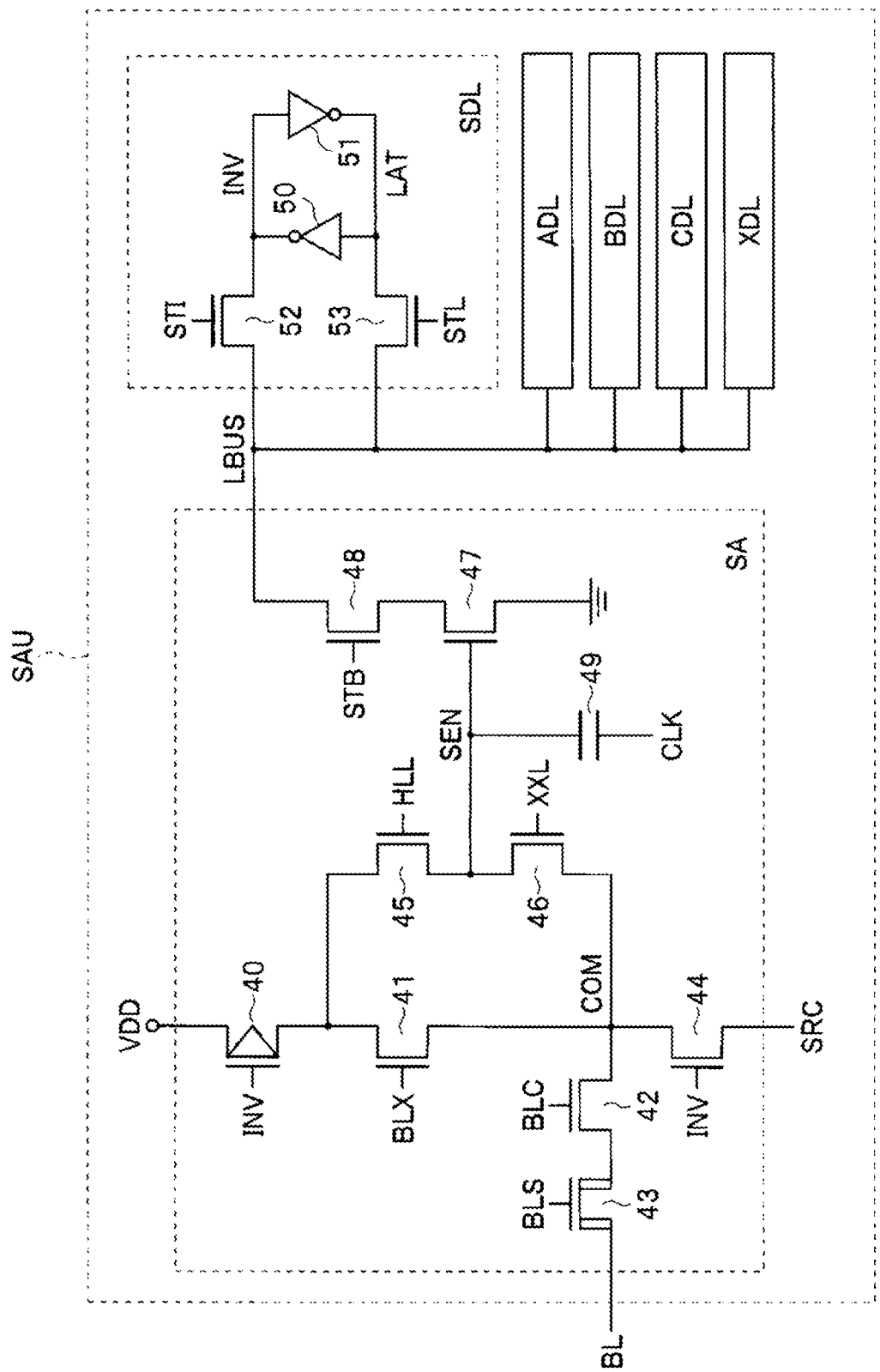
FIG. 7 is a circuit diagram illustrating an example of a specific configuration of a sense amplifier, according to the first embodiment.

FIG. 7 is a circuit diagram illustrating an example of a specific configuration of the sense amplifier 24 in FIG. 2.

The sense amplifier 24 includes a plurality of sense amplifier units SAU associated with bit lines BL0 to BL(m−1), respectively. FIG. 7 illustrates a detailed circuit configuration of a sense amplifier unit SAU.

As illustrated in FIG. 7, the sense amplifier unit SAU includes a sense amplifier unit SA and latch circuits SDL, ADL, BDL, CDL, and XDL. The sense amplifier unit SA and the latch circuits SDL, ADL, BDL, CDL, and XDL are connected by a bus LBUS so as to receive data from each other. The latch circuits SDL, ADL, BDL, CDL, and XDL temporarily store read and write data. The latch circuit XDL is connected to the sequencer 27 and is used for data input/output between the sense amplifier unit SAU and the sequencer 27.

The latch circuit SDL includes, for example, inverters 50 and 51 and n-channel MOS transistors 52 and 53. The input node of the inverter 50 and the output node of the inverter 51 are connected to a node LAT. The input node of the inverter 51 and the output node of the inverter 50 are connected to a node INV. Data of the nodes INV and LAT are stored in the inverters 50 and 51. Write data from the sequencer 27 are supplied to the node LAT. The data stored in the node INV are the inverted data of the data stored in the node LAT.

One end of the drain-source path of the transistor 52 is connected to the node INV, and the other end thereof is connected to the bus LBUS. Further, one end of the drain-source path of the transistor 53 is connected to the node LAT, and the other end thereof is connected to the bus LBUS. A control signal STL is input to the gate of the transistor 53, and a control signal STI is input to the gate of the transistor 52.

Since the latch circuits ADL, BDL, CDR, and XDL have the same circuit configuration as the latch circuit SDL, explanation thereof will not be repeated. Various control signals supplied to the sense amplifier unit SAU are given by the sequencer 27.

The sense amplifier unit SA includes, for example, a p-channel MOS transistor 40, n-channel MOS transistor 41 to 48, and a capacitor 49.

In the read operation, the sense amplifier unit SA senses data read out in the corresponding bit line BL and determines whether the read data is "0" or "1". Further, in the program operation, the sense amplifier unit SA sets the corresponding bit line BL to a voltage value according to data "0" or "1" to be written.

In the sense amplifier unit SA, the transistors 40 to 44 are involved in the program operation. The source-drain path of the transistor 40 and the drain-source path of the transistor 41 are connected in series between a power source line that supplies a voltage VDD, which is the internal power source voltage, and a node COM. Further, the drain-source path of the transistor 44 is connected between the node COM and a node SRC that supplies a voltage VSS, which is the ground voltage. Further, the drain-source path of the transistor 42 and the drain-source path of the transistor 43 are connected in series between the node COM and the bit line BL.

The gates of the transistors 40 and 44 are connected to the node INV. Therefore, when the node LAT is at a low level (hereinafter, referred to as "L") corresponding to the data "0", the node INV is maintained at a high level (hereinafter, referred to as "H") and the transistor 40 is turned off while the transistor 44 is turned on. On the contrary, when the node LAT is at "H" corresponding to the data "1", the node INV is maintained at "L" and the transistor 40 is turned on while the transistor 44 is turned off.

In the program operation, control signals HLL and XXL supplied respectively to the gates of the transistors 45 and 46 are at "L", and the transistors 45 and 46 are turned off. A control signal supplied to the transistor 41 is at "H", and the transistor 41 is turned on. Further, in the normal program operation, the transistors 42 and 43 are electrically connected by control signals BLC and BLS.

Therefore, when the data "0" is stored in the node LAT, the transistor 40 is turned off and the transistor 44 is turned on, so that a bit line voltage Vbl_L such as the voltage VSS (e.g., 0 V) from the node SRC is supplied to the bit line BL. Further, when the data "1" is stored in the node LAT, the transistor 40 is turned on and the transistor 44 is turned off, so that a bit line voltage Vbl_H, for example, 2.5 V or the like, is supplied to the bit line BL depending on the control signals BLC and BLS given to the transistors 42 and 43.

When a program voltage Vpgm is applied to the program target word line WL, in the write target memory cell transistor MT, electrons are stored in the charge storage layer 336 according to the voltage of the corresponding bit line BL. Since the voltage VSS is given to the bit line BL when the data is "0", electrons are stored in the charge storage layer 336 of the write target memory cell transistor by the program voltage Vpgm on a selected word line WL. When the data is "1", since the bit line voltage Vbl_H such as 2.5V is given to the bit line BL, electrons are not stored in the charge storage layer 336 of the write target memory cell transistor by the program voltage Vpgm on the selected word line WL.

Whether the threshold voltage Vth of each cell has reached the target level is determined by a verification operation. The verification operation is the same as the read operation.

All the transistors 40 to 48 and the capacitor 49 of the sense amplifier unit SA are involved in the read operation.

The drain-source path of the transistor 45 and the drain-source path of the transistor 46 are connected in series between the drain of the transistor 40 and the node COM. Further, the drain-source path of the transistor 48 and the drain-source path of the transistor 47 are connected in series between the bus LBUS and a reference voltage point. The source of the transistor 45 and the drain of the transistor 46 are connected to a sense node SEN, and the sense node SEN is connected to the gate of the transistor 47. The control signals HLL and XXL and the voltage of the sense node SEN or a control signal STB are applied to the gates of the transistors 45 to 48, respectively. A clock CLK is applied to the sense node SEN via the capacitor 49.

The data read is performed when the row decoder 25 applies a read voltage to a selected word line WL and the sense amplifier 24 senses the read data to the bit line BL to determine whether the read data is "0" or "1". In order to form a conductive path through a memory cell transistor connected to a non-selected word line WL, the row decoder 25 applies a sufficiently high voltage VREAD required for turning on each memory cell transistor, to the non-selected word line WL. A voltage VREADK slightly higher than the voltage VREAD may be applied to an adjacent word line in order to facilitate the formation of a conductive path through a memory cell transistor connected to the adjacent word line.

In the data read in the current sense method, the row decoder 25 applies a read voltage to a selected word line WL and applies a voltage VREAD or VEREDK to a non-selected word line WL. In the read operation, the sense amplifier 24 fixes the bit line BL to a constant voltage (e.g., 0.5 V) and charges the sense node SEN to a predetermined pre-charge voltage Vpre higher than the voltage of the bit line BL. In this state, the sequencer 27 connects the sense node SEN to the bit line BL. Then, current flows from the sense node SEN to the bit line BL, and the voltage of the sense node SEN gradually decreases.

The voltage of the sense node SEN changes depending on the state of the threshold voltage Vth of the memory cell transistor connected to the corresponding bit line BL. That is, when the threshold voltage Vth of the memory cell transistor is lower than the read voltage, the memory cell transistor is in the turn-on state, a large cell current flows through the memory cell transistor, and the voltage of the sense node SEN drops at a higher speed. When the threshold voltage Vth of the memory cell transistor is higher than the read voltage, the memory cell transistor is in the turn-off state, a cell current flowing through the memory cell transistor is small, or the cell current does not flow through the memory cell transistor, and the voltage of the sense node SEN drops at a lower speed.

Using a difference in the voltage drop speed of the sense node SEN, the write state of the memory cell transistor is determined, and the result thereof is stored in a data latch circuit. For example, at a first time point (t4 to be described later) when a predetermined first period elapses from the start of discharging the charges of the sense node SEN (t3 to be described later), it is determined whether the voltage of the sense node SEN is at a low level ("L") or at a high level ("H"). For example, when the threshold voltage Vth of the memory cell transistor is lower than the read voltage, the memory cell transistor is in a completely turn-on state, and a large cell current flows through the memory cell transistor. Therefore, the voltage of the sense node SEN drops rapidly, the amount of voltage drop is relatively large, and the sense node SEN becomes "L" at the first time point.

When the threshold voltage Vth of the memory cell transistor is higher than the read voltage, the memory cell transistor is in the turn-off state, and a cell current flowing through the memory cell transistor is very small, or the cell current does not flow through the memory cell transistor. Therefore, the voltage of the sense node SEN drops very slowly, the amount of voltage drop is relatively small, and the sense node SEN remains "H" at the first time point.

In this way, it is determined whether the threshold voltage Vth of the memory cell transistor is higher or lower than the read voltage by monitoring the state of the sense node SEN by the sense amplifier unit group 24A while applying the read voltage to the selected word line by the row decoder 25. Therefore, by applying a voltage between levels to the selected word line WL as the read voltage, the level of each memory cell transistor may be determined to read out data assigned to each level.

Figure 8A:
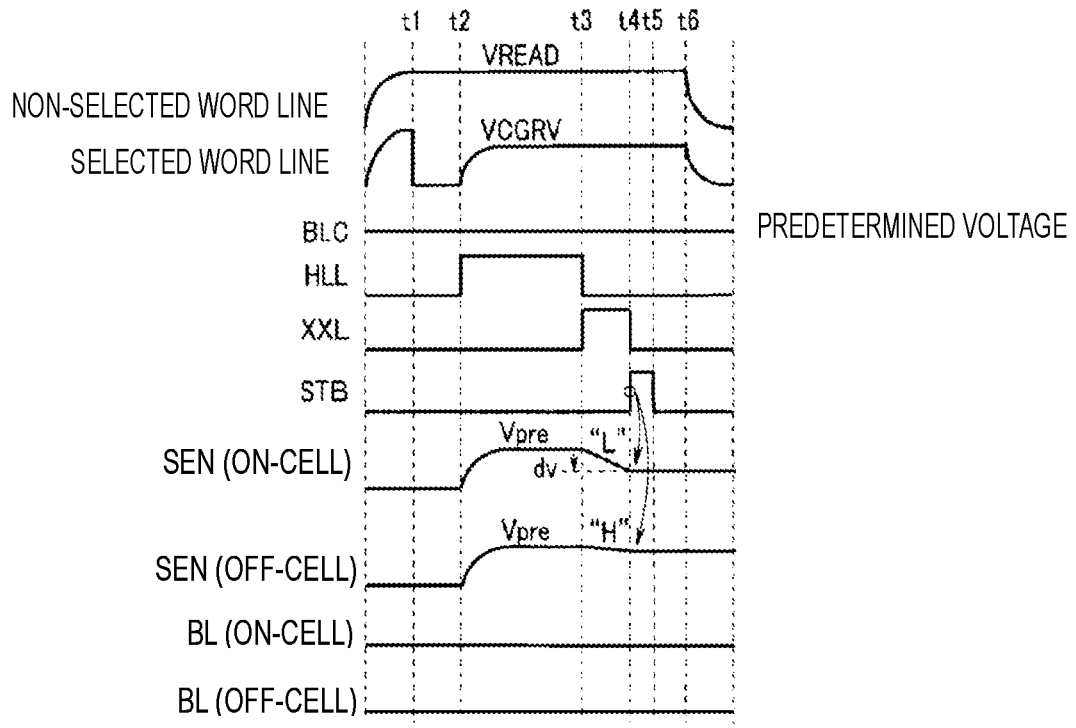
FIG. 8A is a diagram illustrating operation waveforms of the sense amplifier according to the first embodiment.

FIG. 8A is a diagram illustrating an example of operation waveforms of the sense amplifier 24 in the current sense method. First, the row decoder 25 applies a voltage Vv corresponding to the target state as a read voltage to a selected word line WL and applies a non-select read voltage Vpass (e.g., 5 to 7 V) higher than the read voltage Vv to a non-selected word line WL.

In the read operation, the sequencer 27 first sets the node INV to "L" and turns on the transistor 40. Further, the bit line BL is fixed to a constant voltage (e.g., 0.5 V) by turning on the transistor 41 by a control signal BLX and setting the control signal BLC and the control signal BLS to predetermined voltages. Further, the sense node SEN is charged to a predetermined pre-charge voltage Vpre higher than the voltage of the bit line BL by setting the control signal HLL to a predetermined voltage. In this state, when the control signal XXL is set to "H" (t3), current flows from the sense node SEN to the bit line BL via the transistors 46, 42, and 43, and the voltage of the sense node SEN gradually decreases.

The voltage of the sense node SEN changes depending on the state of the threshold voltage Vth of the read target memory cell (also referred to as a selected memory cell). That is, when the threshold voltage Vth of the selected memory cell is lower than the read voltage Vv, the selected memory cell is in the turn-on state, a large cell current flows through the selected memory cell, and the voltage of the sense node SEN drops at a higher speed. When the threshold voltage Vth of the selected memory cell is higher than the read voltage Vv, the selected memory cell is in the turn-off state, a cell current flowing through the selected memory cell is small, or the cell current does not flow through the selected memory cell, and the voltage of the sense node SEN drops at a lower speed.

Therefore, at the first time point t4 when the first period elapses from the start t3 of discharging the charges of the sense node SEN, that is, at the time point when the first period elapses after the control signal XXL is set to "H", when the control signal XXL is set to "L" and the control signal STB is set to "H" to turn on the transistor 48, the transistor 47 is turned on or off depending on whether the voltage of the sense node SEN is at "L" or at "H". When the control signal STB is set to "H" and the transistor 48 is turned on, the transistor 47 is turned on or off depending on the voltage of the sense node SEN, and the bus LBUS is updated. Further, the voltage of the bit line BL is maintained at a constant voltage according to the control signal BLC (almost no voltage drops) regardless of whether the bit line BL is connected to the memory cell transistor in the turn-on state or the memory cell transistor in the turn-off state.

The data read is performed by the sense amplifier 24 by determining the level of each memory cell transistor while changing the read voltage.

Even in the data read with the voltage sense method, the row decoder 25 applies a read voltage to a selected word line WL and applies a voltage VREAD or VREADK to a non-selected word line WL. Further, the row decoder 25 applies the voltage VREAD to the selected gate line SGD corresponding to a selected string SU and also applies the voltage VSS to the selected gate line SGD and the selected gate line SGS corresponding to a non-selected string SU. Further, the sense amplifier 24 charges the bit line BL. After the application of these voltages is completed, the sense amplifier 24 puts the bit line BL in a floating state, and the row decoder 25 applies the voltage VREAD to the selected gate line SGS. Thus, the bit line BL connected to the memory cell transistor in the turn-on state is discharged to the voltage VSS, and the voltage of the bit line BL connected to the memory cell transistor in the turn-off state is maintained (not discharged to the voltage VSS).

Figure 8B:
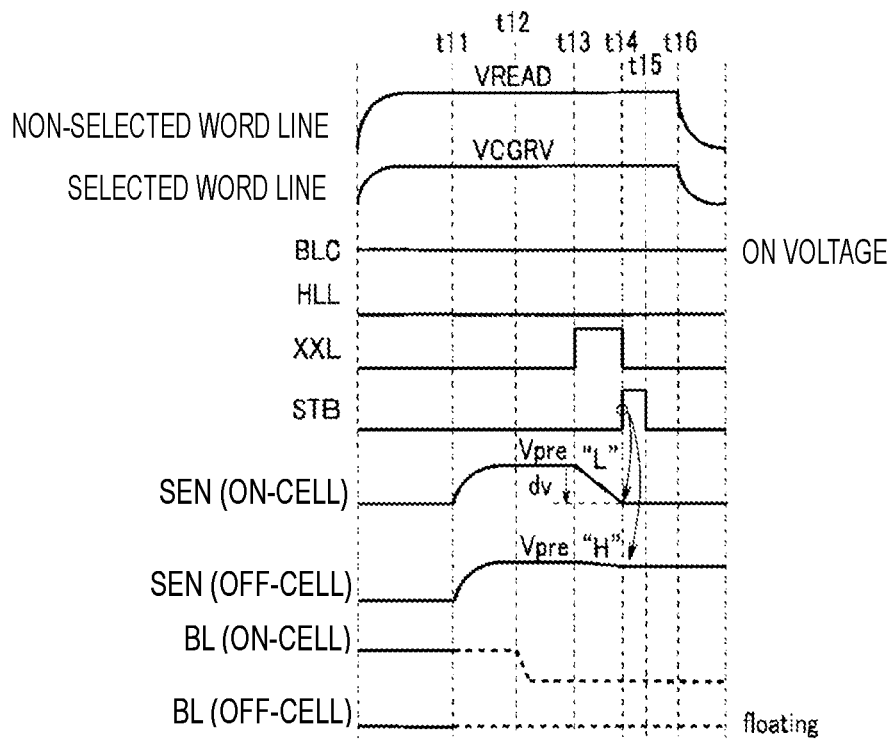
FIG. 8B is a diagram illustrating an example of operation waveforms of a sense amplifier employing a voltage sense method, according to the first embodiment.

FIG. 8B is a diagram illustrating an example of operation waveforms of the sense amplifier 24 in the data read with the voltage sense method. After the bit line BL is charged, when the voltage VREAD is applied to the selected gate line SGS at a time t12 after the time point t11 when the bit line BL is put into a floating state, the bit line BL connected to the memory cell transistor in the turn-on state is discharged to the voltage VSS, and the voltage of the bit line BL connected to the memory cell transistor in the turn-off state is maintained (not discharged to the voltage VSS).

After that, at a second time point t14 when the second period elapses from the start t13 of discharging the charges of the sense node SEN, that is, at the time point when the second period elapses after the control signal XXL is set to "H", when the control signal XXL is set to "L" and the control signal STB is set to "H" to turn on the transistor 48, the transistor 47 is turned on or off depending on whether the voltage of the sense node SEN is at "L" or at "H".

Figure 9:
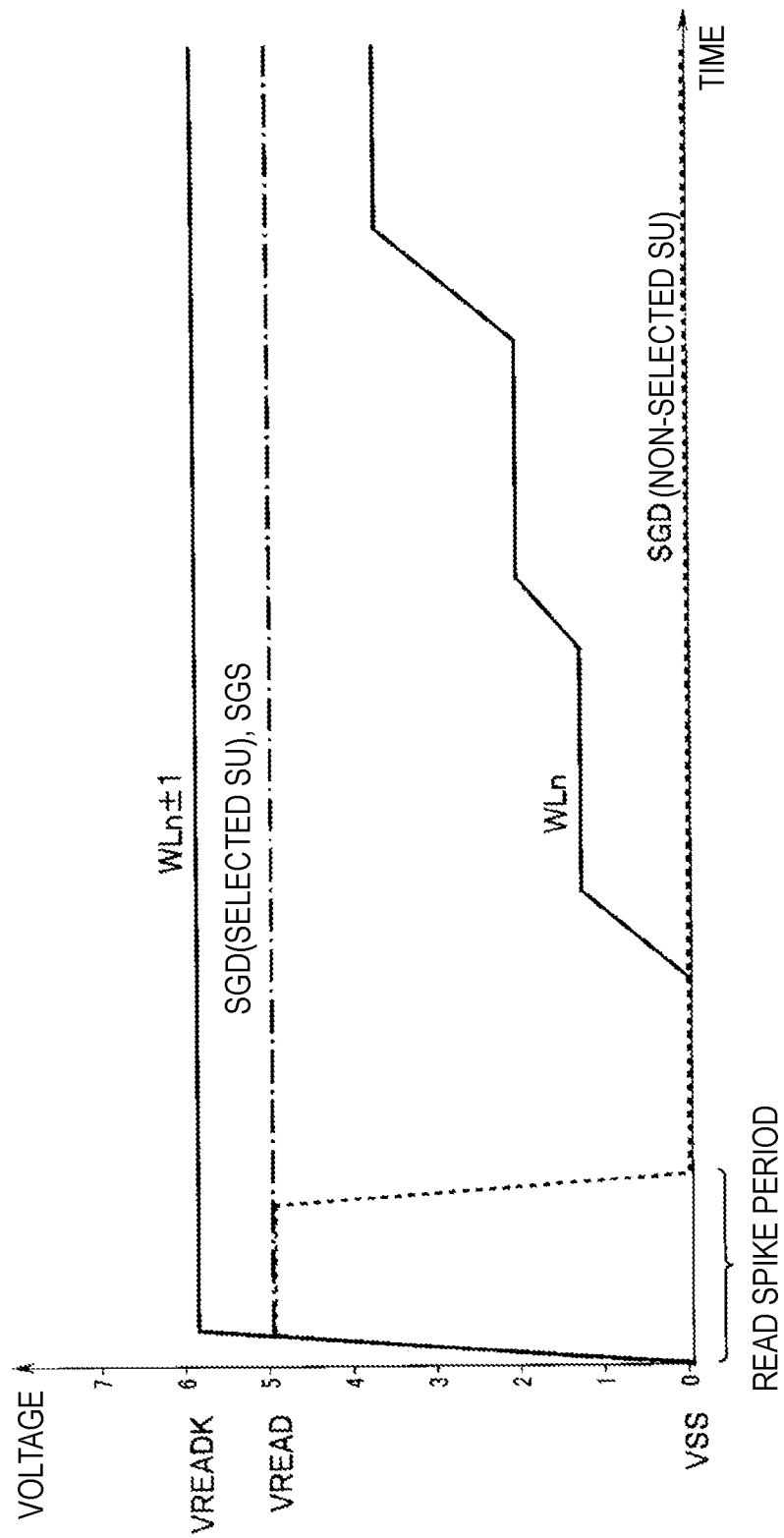
FIG. 9 is a waveform diagram illustrating a change in voltage in reading with a current sense method, according to the first embodiment.

FIG. 9 is a waveform diagram illustrating a change in voltage in the data read with the current sense method. The horizontal axis represents time, and the vertical axis represents a voltage. FIG. 9 illustrates a case where the voltage of a read target word line WLn is changed three times when a certain page is read out.

In the data read with the current sense method, a read spike period in which a predetermined voltage of, for example, about the read voltage VREAD (5 V) is applied to the selected gate lines SGS and SGD and all the word lines WL is provided at the start of a series of reads. Then, after the end of the read spike period, the voltage of the selected gate line SGD corresponding to a non-selected string unit SU is lowered to about the voltage VSS, and in order to read out the data of the memory cell transistor, a read voltage VCGRV is shifted to the positive direction while continuously applying a voltage of about VREAD to the selected gate line SGD and the selected gate line SGS corresponding to a selected string unit SU.

Figure 10:
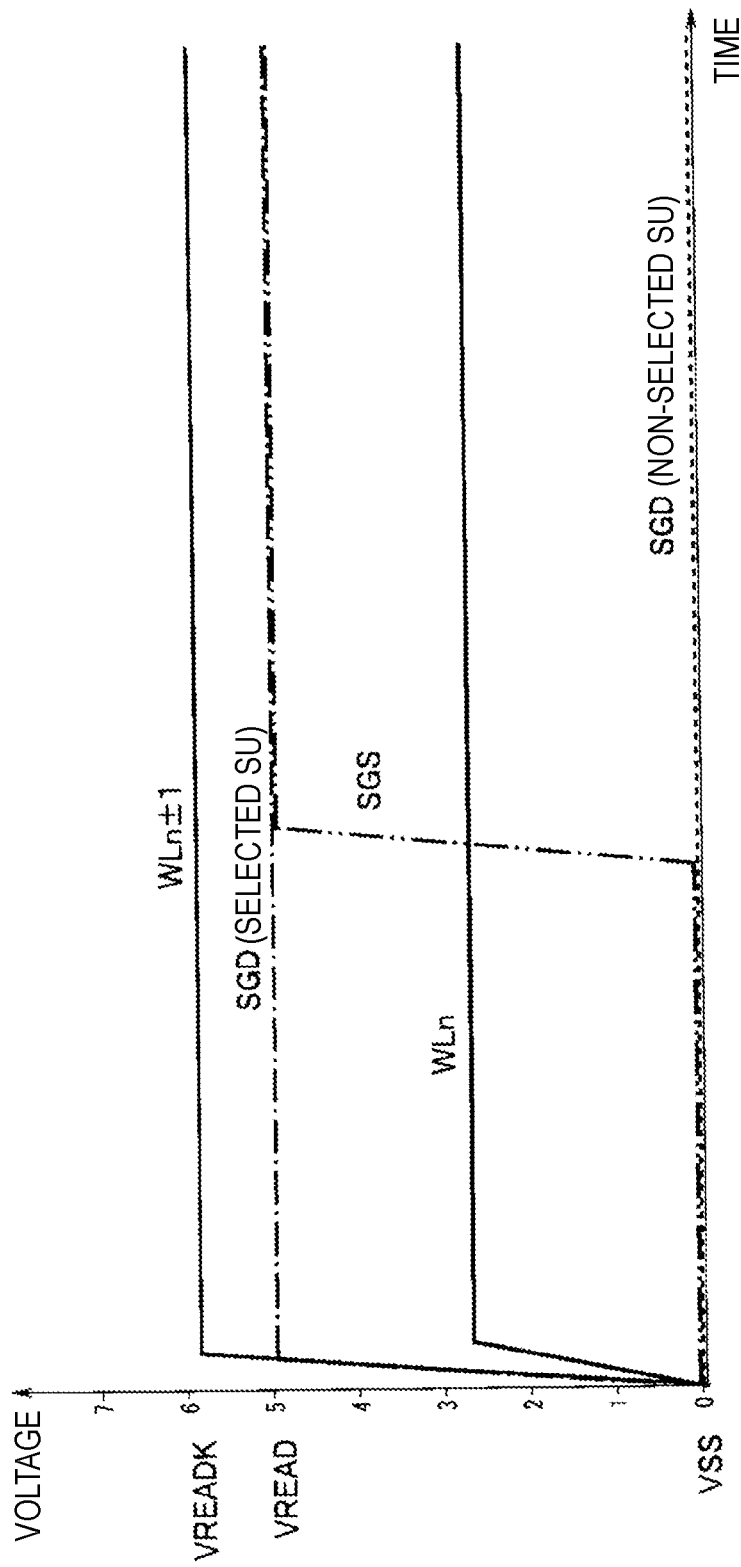
FIG. 10 is a waveform diagram illustrating a change in voltage in reading with a voltage sense method, according to the first embodiment.

FIG. 10 is a waveform diagram illustrating a change in voltage in the data read with the voltage sense method. The horizontal axis represents time, and the vertical axis represents a voltage.

For example, the system information and the like are written in the ROM area at 1-bit/cell. That is, the system information and the like are written in the ROM area as binary data (i.e., 1-bit data).

In the data read with the voltage sense method, the read voltage VCGRV is applied to the selected word line WL. In addition, a voltage of about VREAD is applied to the select gate line SGD of the selected string unit SU and all the word line WLs except the selected word line WL corresponding to the selected string unit SU, and a voltage of about VSS is applied to the select gate line SGD corresponding to the non-selected string unit SU and the select gate line SGS. Then, after the application of those voltages is completed, a voltage of about VREAD is applied to the select gate line SGS.

The plurality of bit line BLs have even-numbered bit lines BLe and odd-numbered bit lines BLo when counted in order from one end of the bit lines BL to the other end of the bit lines BL in the block BLK. In order to ensure the read accuracy of the system information, the even-numbered bit data and the odd-numbered bit data of the system information are read out separately.

In the present embodiment, the system information is stored in a system information area so that the system information may be checked for errors by comparing data of two data portions (df1 and df2). As will be described later, the system information may be checked for errors by comparing the two data portions (df1 and df2) included in the even-numbered (even-numbered bit lines BLe) data with each other and the two data portions (df1 and df2) included in the odd-numbered (odd-numbered bit lines BLo) data with each other.

Figure 11:
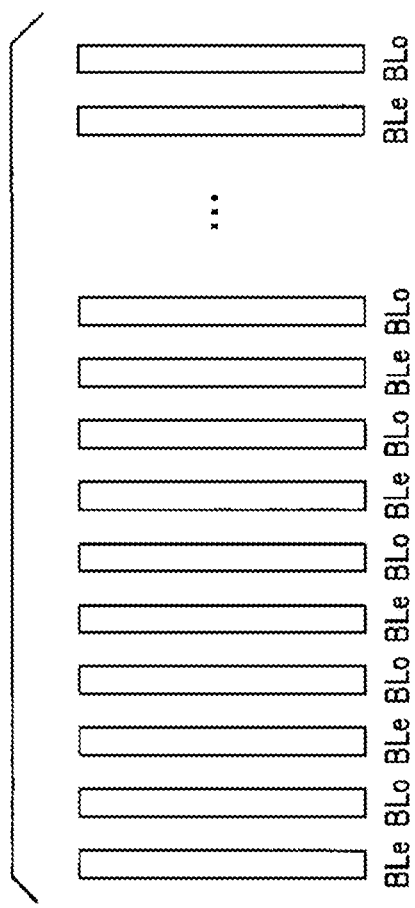
FIG. 11 is a diagram schematically illustrating the arrangement of even-numbered bit lines and odd-numbered bit lines in a plurality of bit lines, according to the first embodiment.

FIG. 11 is a diagram schematically illustrating the arrangement of the even-numbered bit lines BLe and the odd-numbered bit lines BLo in a plurality of bit lines BL.

Figure 12:
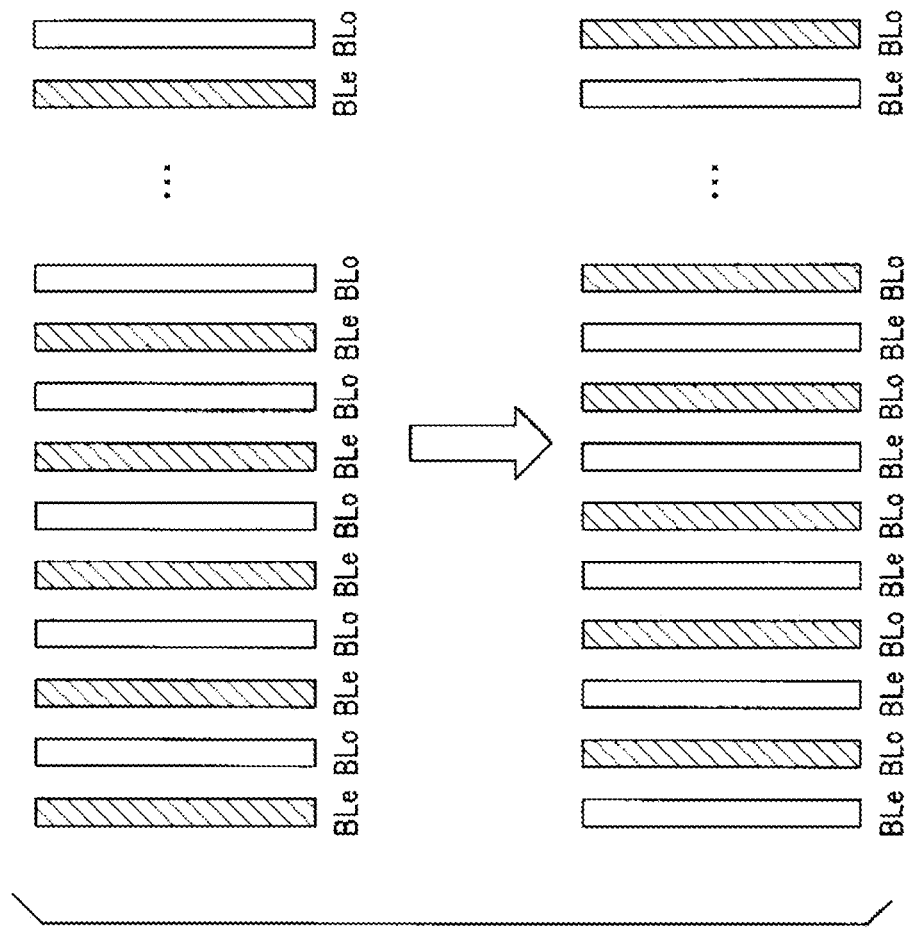
FIG. 12 is a diagram illustrating a case where data are read separately for the even-numbered bit lines and the odd-numbered bit lines, according to the first embodiment.

FIG. 12 is a diagram illustrating a case where data are read separately for the even-numbered bit lines BLe and the odd-numbered bit lines BLo.

The sense amplifier 24 may first read out data of the even-numbered bit lines BLe (indicated by an oblique line), as illustrated in the upper side of FIG. 12, and then may read out data of the odd-numbered bit lines BLo (indicated by an oblique line), as illustrated in the lower side of FIG. 12. Alternatively, the sense amplifier 24 may first read out the data of the odd-numbered bit lines BLo (indicated by the oblique line) and then may read out the data of the even-numbered bit lines BLe (indicated by the oblique line).

When the data read for the even-numbered bit lines BLe is performed, for example, the voltage VSS is applied to the odd-numbered bit lines BLo. This is for shielding each even-numbered bit line BLe by two odd-numbered bit lines BLo on both sides thereof.

Similarly, when the data read for the odd-numbered bit lines BLo is performed, for example, the voltage VSS is applied to the even-numbered bit lines BLe. This is for shielding each odd-numbered bit line BLo by two even-numbered bit lines BLe on both sides thereof.

Therefore, the sequencer 27 may independently read out the even-numbered bit lines BLe and the odd-numbered bit lines BLo by controlling the sense amplifier 24.

(Read of System Information)

Next, the read of the system information will be described.

As described above, the system information includes the defective block information, the column redundancy information, and the trimming information. The system information is information required for the non-volatile memory 2 to operate.

The same system information is stored in two divided data portions so that it may be checked against each other to confirm whether the read information is correct. The system information is stored on one page. In that case, the same data are stored in the two different data portions of one page. By checking whether the two data match, it is determined whether the system information is correct. This check will be described later.

In the present embodiment, in order to read out the system information quickly, the data read out through the even-numbered bit lines BLe is performed in one of the two planes P0 and P1, and the data read out through the odd-numbered bit lines BLo performed in the other of the two planes P0 and P1.

Figure 13:
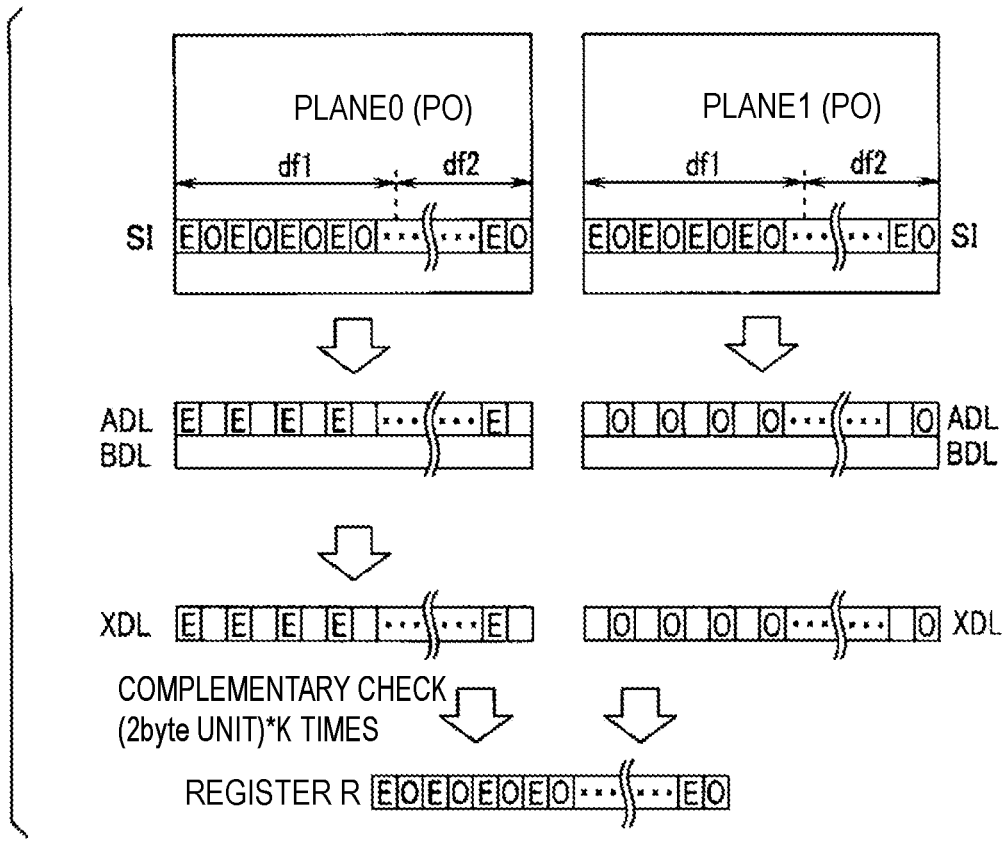
FIG. 13 is a diagram illustrating a flow of process for reading out system information from two planes, according to the first embodiment.

FIG. 13 is a diagram illustrating a process of flow for reading the system information from the two planes P0 and P1.

The system information SI includes even-numbered bit data E read from the even-numbered bit lines BLe and odd-numbered bit data O read from the odd-numbered bit lines BLo. As described above, the system information SI stored in the plane P0 is the same data as the system information SI stored in the plane P1. The system information SI has two data portions df1 and df2. Data of the data portion df1 and data of the data portion df2 are the same.

The even-numbered bit data E are data that are read when a bit line BLe is selected. The odd-numbered bit data O are data that are read when a bit line BLo is selected. As illustrated in FIG. 13, the even-numbered bit data E are stored in the latch circuit ADL of the plane P0, and the odd-numbered bit data O are stored in the latch circuit ADL of the plane P1. That is, the latch circuit ADL of each of the planes P0 and P1 may store the even-numbered bit data E or the odd-numbered bit data O of the system information SI read from the memory cell array 23 of the planes P0 and P1. One of the even-numbered bit data E and the odd-numbered bit data O of the system information SI is stored in the latch circuit ADL of the plane P0, and the other of the even-numbered bit data E and the odd-numbered bit data O of the system information SI is stored in the latch circuit ADL of the plane P1.

A process of reading out the even-numbered bit data E from the system information SI of the plane P0 and transferring the read-out data to the latch circuit ADL and a process of reading out the odd-numbered bit data O from the system information SI of the plane P1 and transferring the read-out data to the latch circuit ADL are executed in parallel. The read operation of the system information SI in each of the planes P0 and P1 is executed by the sequencer 27. That is, the sequencer 27, which is a control circuit, executes in parallel a first process of reading out one of the even-numbered bit data E and the odd-numbered bit data O and storing the read-out data in the latch circuit ADL of the plane P0 and a second process of reading out the other of the even-numbered bit data E and the odd-numbered bit data O and storing the read-out data in the latch circuit ADL of the plane P0.

The sequencer 27 transfers the even-numbered bit data E of the latch circuit ADL of the plane P0 to the latch circuit XDL of the plane P0. Similarly, the sequencer 27 transfers the odd-numbered bit data O of the latch circuit ADL of the plane P1 to the latch circuit XDL of the plane P1.

In FIG. 2, a two-dot chain line d0 indicates that the even-numbered bit data E are read from the ROM block ROMBLK of the memory cell array 23 of the plane P0 and stored in the latch circuit XDL. Similarly, in FIG. 2, a two-dot chain line d1 indicates that the odd-numbered bit data O are read from the ROM block ROMBLK of the memory cell array 23 of the plane P1 and stored in the latch circuit XDL.

The even-numbered bit data E of the latch circuit XDL of the plane P0 and the odd-numbered bit data O of the latch circuit XDL of the plane P1 are transferred to the sequencer 27 via the register circuit 26. The sequencer 27 performs a data check on the even-numbered bit data E and the odd-numbered bit data O. For example, the sequencer 27 executes a complementary check on the received even-numbered bit data E to judge whether the even-numbered bit data E has been safely read out from the plane P0, and then executes a complementary check on the received odd-numbered bit data O to judge whether the odd-numbered bit data O has been safely read out from the plane P1. Other kind of check than the complementary check may be performed as the data check.

In FIG. 2, a two-dot chain line d01 indicates that the even-numbered bit data E stored in the latch circuit XDL of the plane P0 are transferred to the sequencer 27. Similarly, in FIG. 2, a two-dot chain line d11 indicates that the odd-numbered bit data O stored in the latch circuit XDL of the plane P1 is transferred to the sequencer 27.

When it has been confirmed that there are no errors in the even-numbered bit data E and the odd-numbered bit data O, the sequencer 27 combines the even-numbered bit data E and the odd-numbered bit data O and stores the system information SI in the register R.

As described above, the system information SI is stored in the ROM area such that the same data are stored in the two divided data portions df1 and df2 to allow a complementary check therebetween. By comparing the two pieces corresponding to the two data portions df1 and df2 in the even-numbered data and comparing the two pieces corresponding to the two data portions df1 and df2 in the odd-numbered data, it may be checked whether the transferred system information SI has an error.

The complementary check is performed by comparing the two pieces of data of the two data portions df1 and df2 in the unit of 2-byte to determine whether they match. That is, in the even-numbered bit data E, the two data portions df1 and df2 are compared in the unit of 2-byte to determine whether the data match. In addition, in the odd-numbered bit data O, the two data portions df1 and df2 are compared in the unit of 2-byte to determine whether the data match. Therefore, when the data size of the system information SI is L bytes, the data comparison is performed as many times (k) as the number of times (L/2) bytes are divided by 2.

Although the complementary check is executed in the sequencer 27 here, the complementary check may be executed in a dedicated circuit. That is, in the embodiment, the determination on whether each of the even-numbered bit data E and the odd-numbered bit data O has an error is performed by the sequencer 27, but it may be performed by a circuit different from the sequencer 27.

For example, as illustrated by a dotted line in FIG. 2, a complementary check circuit 24C may be provided in each sense amplifier 24 so that the complementary check of the even-numbered bit data E and the complementary check of the odd-numbered bit data O may be executed in parallel. That is, the complementary check circuit 24C of the sense amplifier 24 of the plane P0 functions as a first determination circuit for determining whether the even-numbered bit data E have an error, and the complementary check circuit 24C of the sense amplifier 24 of the plane P1 functions as a second determination circuit for determining whether the odd-numbered bit data O have an error. In this case, the power-on-read operation time becomes shorter because the complementary checks are performed in parallel. The check results of the two complementary checks are notified to the sequencer 27.

According to the present embodiment, since the process of reading the even-numbered bit data E from the ROM area of the plane P0 and transferring the read data to the latch circuit ADL and the process of reading the odd-numbered bit data O from the ROM area of the plane P1 and transferring the read data to the latch circuit ADL are executed in parallel, the system information SI may be read out quickly.

In a comparative example, a method of reading system information includes reading the even-numbered bit data E from the ROM area of the plane P0 and transferring the read data to the latch circuit ADL and then reading the odd-numbered bit data O from the ROM area of the plane P0 and transferring the read data to the latch circuit BDL. In the case of this method, the even-numbered bit data E and the odd-numbered bit data O are combined and transferred to the latch circuit XDL as system information. Data stored in the latch circuit XDL are checked for errors.

However, in this case, when there is an error in either the even-numbered bit data E or the odd-numbered bit data O, the same operation is performed using the plane P1 next. Therefore, a process of reading the even-numbered bit data E from the ROM area of the plane P1 and transferring the read data to the latch circuit ADL and then reading the odd-numbered bit data O from the ROM area of the plane P1 and storing the read data in the latch circuit BDL is executed again, which is a time-consuming process.

Figure 14:
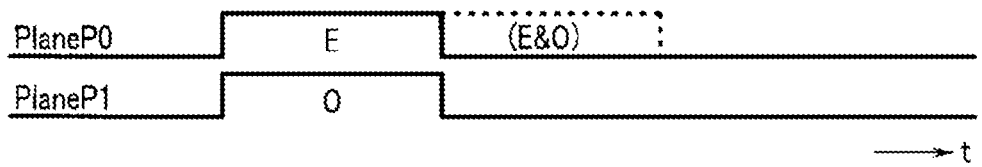
FIG. 14 is a diagram illustrating a comparison of read times of the system information in the first embodiment.

FIG. 14 is a diagram illustrating a comparison of read times of the system information SI in the above-described embodiment.

In the above-described embodiment (indicated by a solid line in FIG. 14), the read of the even-numbered bit data E and the read of the odd-numbered bit data O are performed in parallel. As indicated by a dotted line, in the case of the comparative example, the read of the even-numbered bit data E and the read of the odd-numbered bit data O are performed sequentially.

Therefore, in the above-described first embodiment, since the process of reading out the even-numbered bit data E of the plane P0 and storing the read data in the latch circuit XDL and the process of reading out the odd-numbered bit data O of the plane P1 and storing the read data in the latch circuit XDL are executed in parallel, the read time of each of the even-numbered bit data E and the odd-numbered bit data O of the system information SI is halved as compared with this comparative example.

As described above, according to the above-described embodiment, it is possible to provide a semiconductor storage device that shortens the time required for power-on-read operation.

(Modification)

In the above configuration, the first process of reading the even-numbered bit data E of the system information SI from the ROM block ROMBLK of the plane P0 and transferring the read data to the latch circuit ADL and the second process of reading the odd-numbered bit data O of the system information SI from the ROM block ROMBLK of the plane P1 and transferring the read data to the latch circuit ADL are executed in parallel. However, since the first and second processes are started at the same time, a peak current in the non-volatile memory 2 becomes larger. Since the setup such as charging the word line WL and the bit line BL is performed in order to read the data, a peak current is generated at the start of reading out the even-numbered bit data E and the odd-numbered bit data O.

Therefore, in this modification, a time difference is provided between the execution start time of the first process and the execution start time of the second process so that such a peak current does not become larger. That is, the two timings are shifted from each other so that the execution start timing of the first process and the execution start timing of the second process do not coincide with each other.

Figure 15:
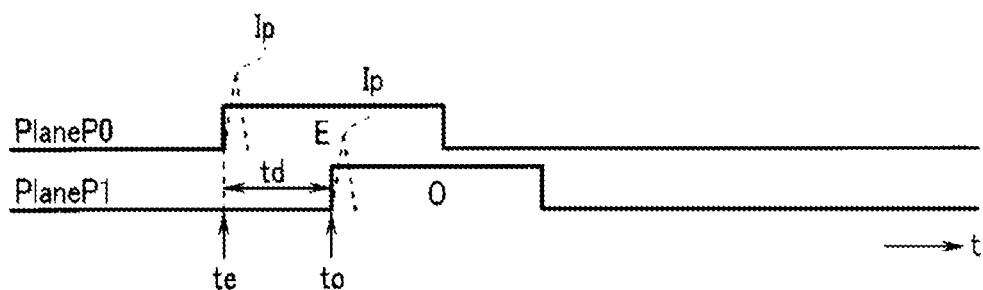
FIG. 15 is a diagram illustrating the timing of peak current generation in a modification of the first embodiment.

FIG. 15 is a diagram illustrating the generation timing of the peak current in this modification. The timing te at which the even-numbered bit data E of the system information SI are read from the ROM block ROMBLK of the plane P0 and the timing to at which the odd-numbered bit data O of the system information SI are read from the ROM block ROMBLK of the plane P1 are shifted from by time td.

Therefore, the generation timing of a peak current Ip due to the timing te and the generation timing of the peak current Ip due to the timing to do not overlap with each other. In FIG. 15, the generation timing of the peak current Ip is indicated by a mountain-shaped dotted line.

According to this modification, the timing of the peak current in the first process of reading out the even-numbered bit data E and the timing of the peak current in the second process of reading out the odd-numbered bit data O do not overlap with each other. Therefore, the peak current in the non-volatile memory 2 may be reduced.

Second Embodiment

In the first embodiment, the even-numbered bit data E are read from one plane, and the odd-numbered bit data O are read from another plane. However, in a second embodiment, when there is an error in the even-numbered bit data E or the odd-numbered bit data O read from one plane, the even-numbered bit data E or the odd-numbered bit data O with the error is read from the other plane.

Since the memory system of the second embodiment has the same configuration as the memory system of the first embodiment, the same elements are denoted by the same reference numerals, and only different configurations thereof will be described.

Figure 16:
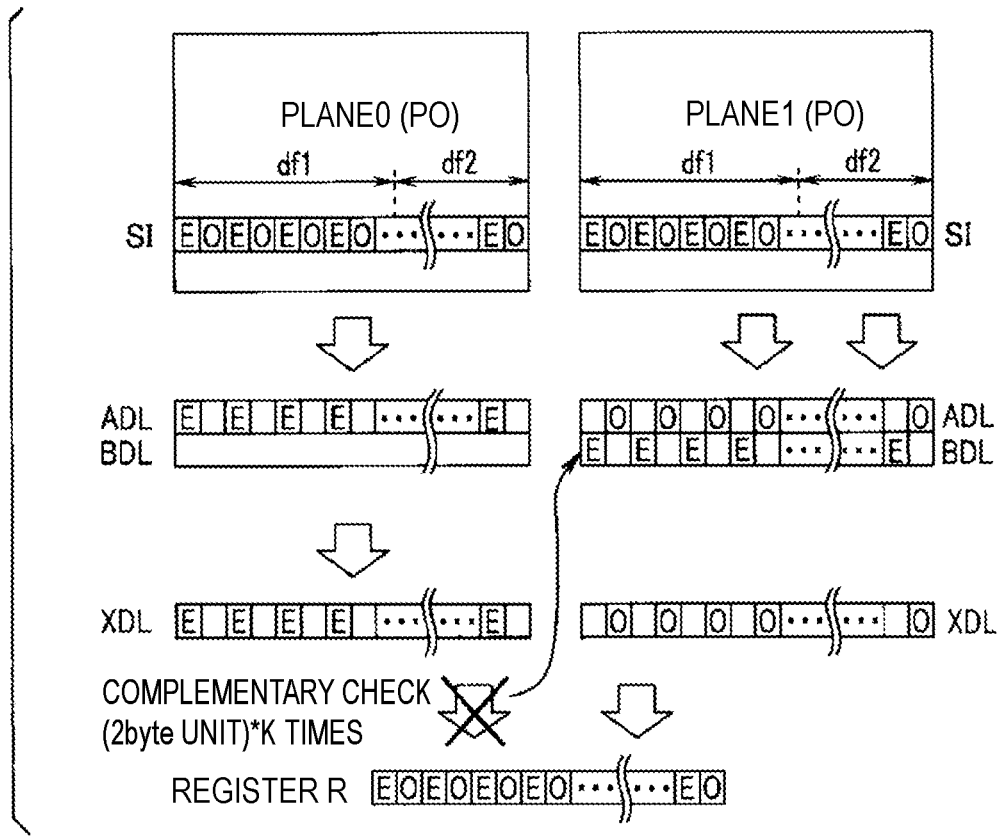
FIG. 16 is a diagram illustrating a flow of process for reading out system information from two planes, according to a second embodiment.
Figure 17:
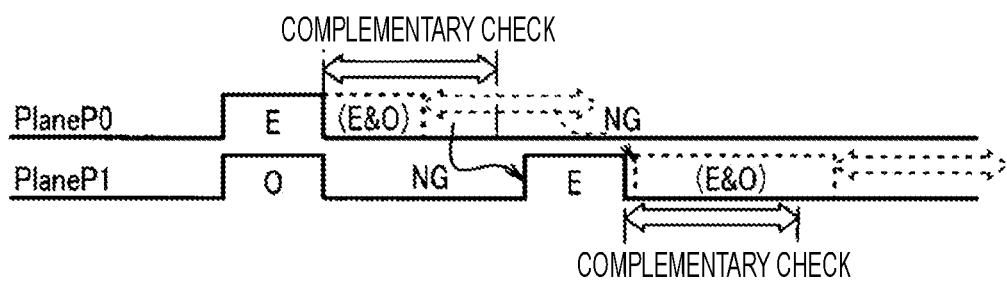
FIG. 17 is a diagram illustrating the read time of the system information in the second embodiment.

FIG. 16 is a diagram illustrating a flow of process for reading out the system information from the two planes P0 and P1, according to the second embodiment. FIG. 17 is a diagram illustrating a comparison of read times of the system information SI in the second embodiment.

For example, the even-numbered bit data E of the system information SI are read from the ROM block ROMBLK of the plane P0 and stored in the latch circuit ADL. The odd-numbered bit data O of the system information SI are read from the ROM block ROMBLK of the plane P1 and stored in the latch circuit ADL. In this case, as a result of a complementary check, when there is an error in the even-numbered bit data E (indicated by "x"), the sequencer 27 reads the even-numbered bit data E from the ROM block ROMBLK of the plane P1 and stores the read data in the latch circuit BDL.

Then, a complementary check is performed on the even-numbered bit data E read from the ROM area of the plane P1. As a result of the complementary check, when there is no error in the even-numbered bit data E, the even-numbered bit data E read from the ROM block ROMBLK of the plane P1 and the odd-numbered bit data O are combined to generate the system information SI and store the read data in the register R.

According to the present embodiment, since only data having an error (the even-numbered bit data E or the odd-numbered bit data O) as the result of the complementary check are read from a plane having no error (the plane P1 in the above example), the system information may be read out quickly.

A dotted line in FIG. 17 indicates that the complementary check is performed after the even-numbered bit data E and the odd-numbered bit data O are read from the ROM block ROMBLK of the plane P0 in the above-mentioned comparative example. Then, when there is an error in either the even-numbered bit data E or the odd-numbered bit data O in the complementary check, the even-numbered bit data E and the odd-numbered bit data O are read from the ROM block ROMBLK of the plane P1 and the complementary check is performed. Therefore, in the comparative example, the power-on-read time becomes longer.

In contrast, in the present embodiment, when there is an error in either the even-numbered bit data E or the odd-numbered bit data O in one of the two planes, the other plane is used to read out only even- or odd-numbered bit data having the error. That is, when it is determined that one of the even-numbered bit data E and the odd-numbered bit data O has an error based on the result of the determination on whether the even-numbered bit data E or the odd-numbered bit data O has an error, the sequencer 27 executes a third process of reading one of the even-numbered bit data E and the odd-numbered bit data O from the memory cell array 23 of a plane that has read out the other of the even-numbered bit data E and the odd-numbered bit data O that was not determined to have an error. The determination on whether the even-numbered bit data E or the odd-numbered bit data O has an error may be performed by a circuit different from the sequencer 27.

Therefore, in the second embodiment, in addition to the effects of the first embodiment, even when there is an error in the read even-numbered bit data E or odd-numbered bit data O, the system information may be read out quickly.

The modification of the first embodiment is also applicable to the second embodiment. That is, the generation timing of the peak current Ip when reading out the even-numbered bit data E and the generation timing of the peak current Ip when reading out the odd-numbered bit data O may not overlap with each other.

Third Embodiment

In the second embodiment, when it is determined that the even-numbered bit data E or the odd-numbered bit data O read from one plane has an error, the even-numbered bit data E or the odd-numbered bit data O having the error are read from the other plane having no error. However, in a third embodiment, without waiting for a determination on whether the even-numbered bit data E or the odd-numbered bit data O read from the two planes P0 and P1 has an error, unread odd-numbered bit data O and even-numbered bit data E are read from the two planes P0 and P1, respectively, during the complementary check. That is, in the third embodiment, in preparation for a case where one of the even-numbered bit data E and the odd-numbered bit data O read from the two planes P0 and P1 has an error, both the even-numbered bit data E and the odd-numbered bit data O are read in advance from each of the planes P0 and P1.

Since the memory system of the third embodiment has the same configuration as the memory systems of the first and second embodiments, the same elements are denoted by the same reference numerals, and only different configurations thereof will be described.

Figure 18:
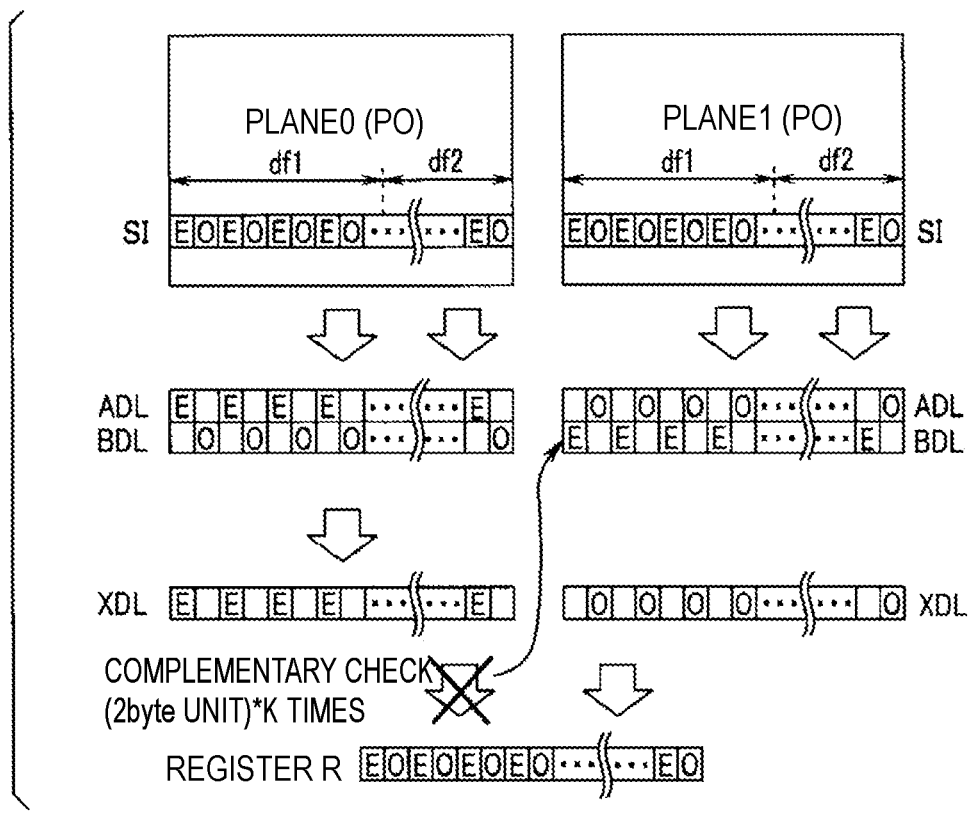
FIG. 18 is a diagram illustrating a flow of process for reading out system information from two planes, according to a third embodiment.
Figure 19:
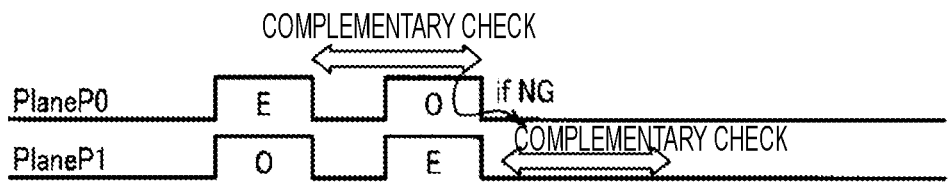
FIG. 19 is a diagram illustrating the read time of the system information in the third embodiment.

FIG. 18 is a diagram illustrating a flow of process for reading out the system information from the two planes P0 and P1, according to the third embodiment. FIG. 19 is a diagram illustrating read times of the system information SI in the third embodiment.

As illustrated in FIG. 18, the even-numbered bit data E and the odd-numbered bit data O are read from the planes P0 and P1, respectively. After that, a complementary check is executed for the read even-numbered bit data E and odd-numbered bit data O. When this complementary check is being executed, the odd-numbered bit data O and the even-numbered bit data E are read from the planes P0 and P1, respectively.

When one of the even-numbered bit data E and the odd-numbered bit data O read from the two planes P0 and P1 has an error, after it is found that there is the error, the sequencer 27 may immediately use data read in the other plane than the plane having the error in the data for the complementary check.

In FIG. 18, after the even-numbered bit data E are read from the plane P0 and stored in the latch circuit ADL and the odd-numbered bit data ODD are read from the plane P1 and stored in the latch circuit ADL, the complementary check is executed for both the even-numbered bit data E and the odd-numbered bit data O.

While the complementary check is being executed, the read of the odd-numbered bit data O from the plane P0 is started, and the odd-numbered bit data O are stored in the latch circuit BDL. Similarly, while the complementary check is being executed, the read of the even-numbered bit data E from the plane P1 is started, and the even-numbered bit data E are stored in the latch circuit BDL. That is, without waiting for a result of the complementary check to be known, the sequencer 27 starts the read of the odd-numbered bit data and the even-numbered bit data opposite to the already read even-numbered bit data E and odd-numbered bit data O from the planes P0 and P1.

FIG. 19 illustrates a case where the complementary check is executed for the even-numbered bit data E already read in the plane P1 when it is determined that the even-numbered bit data E read from the plane P0 has an error.

As described above, the sequencer 27 executes the third process of reading the odd-numbered bit data O from the memory cell array 23 of the plane P0 and reading the even-numbered bit data E from the memory cell array 23 of the plane P1 when it is determined whether the even-numbered bit data E or the odd-numbered bit data O have an error. The determination on whether the even-numbered bit data E or the odd-numbered bit data O has an error may be performed by a circuit different from the sequencer 27.

According to the third embodiment, in preparation for a case where an error is detected in the result of the complementary check, since both the even-numbered bit data E and the odd-numbered bit data O are read in advance in each plane, the system information SI may be read out quickly.

Therefore, in the third embodiment, in addition to the effects of the first embodiment, even when there is an error in the read even-numbered bit data E or odd-numbered bit data O, the system information may be read out quickly.

The modification of the first embodiment is also applicable to the third embodiment. That is, the generation timing of the peak current Ip when reading out the even-numbered bit data E and the generation timing of the peak current Ip when reading out the odd-numbered bit data O may not overlap with each other.

As described above, according to each of the above-described embodiments, it is possible to provide a semiconductor storage device that shortens the time required for power-on-read operation.

While certain embodiments have been described, these embodiments have been presented by way of example only, and are not intended to limit the scope of the disclosure.

Indeed, the novel embodiments described herein may be embodied in a variety of other forms; furthermore, various omissions, substitutions and changes in the form of the embodiments described herein may be made without departing from the spirit of the disclosure. The accompanying claims and their equivalents are intended to cover such forms or modifications as would fall within the scope and spirit of the disclosure.

What is claimed is:

1. A semiconductor storage device comprising:
a first memory cell array configured to store user data and system information, which is used for a write operation and a read operation on the user data;
a second memory cell array configured to store the user data and the system information;
a first latch circuit configured to store first bit data which are even-numbered bit data of the system information read from the first memory cell array;
a second latch circuit configured to store second bit data which are odd-numbered bit data of the system information read from the second memory cell array; and
a control circuit configured to execute in parallel a first process of reading the first bit data and storing the read first bit data in the first latch circuit and a second process of reading the second bit data and storing the read second bit data in the second latch circuit.

2. The semiconductor storage device according to claim 1, wherein
upon determining that the first bit data have an error, the control circuit executes a third process of reading the even-numbered bit data of the system information from the second memory cell array.

3. The semiconductor storage device according to claim 2, wherein the determination of whether the first bit data or the second bit data has an error is performed by the control circuit.

4. The semiconductor storage device according to claim 2, wherein the determination on whether the first bit data or the second bit data has an error is performed by another circuit different from the control circuit.

5. The semiconductor storage device according to claim 4, wherein said another circuit includes a first determination circuit that determines whether the first bit data have an error, and a second determination circuit that determines whether the second bit data have an error.

6. The semiconductor storage device according to claim 1, wherein the even-numbered bit data of the system information read from the first memory cell array includes two copies of first system information and the odd-numbered bit data of the system information read from the second memory cell array includes two copies of second system information.

7. The semiconductor storage device according to claim 6, wherein the system information stored in the first memory cell array is identical to the system information stored in the second memory cell array.

8. The semiconductor storage device according to claim 1, wherein the user data are stored in the first and second memory cell array at a storage density of n1-bits per memory cell and the data of the system information are stored in the first and second memory cell array at a storage density of n2-bits per memory cell, where n2 is less than n1.

9. A semiconductor storage device comprising:
a first memory cell array configured to store user data and system information, which is used for a write operation and a read operation on the user data;
a plurality of first bit lines;
a second memory cell array configured to store the user data and the system information;
a plurality of second bit lines;
a first latch circuit configured to store first system information which are read from the first memory cell array;
a second latch circuit configured to store second system information which are read from the second memory cell array; and
a control circuit configured to execute a first process of reading the first system information from the first memory cell array using even-numbered first bit lines and storing the first system information in the first latch circuit during a first time period and a second process of reading the second system information from the second memory cell array using odd-numbered second bit lines and storing the second system information in the second latch circuit during a second time period that overlaps with the first time period.

10. The semiconductor storage device according to claim 9, wherein the second time period starts and ends at a later time relative to the first time period.

11. The semiconductor storage device according to claim 10, wherein the second time period starts at approximately midway through the first time period.

12. The semiconductor storage device according to claim 9, wherein the system information is reconstructed from the first system information stored in the first latch circuit and the second system information stored in the second latch circuit.

13. The semiconductor storage device according to claim 9, wherein the system information is reconstructed from one of the first system information stored in the first latch circuit and the second system information stored in the second latch circuit, and a third system information read from the first memory cell array if the second system information has an error or the second memory cell array if the first system information has an error.

14. The semiconductor storage device according to claim 9, wherein the user data are stored in the first and second memory cell array at a storage density of n1-bits per memory cell and the data of the system information are stored in the first and second memory cell array at a storage density of n2-bits per memory cell, where n2 is less than n1.

15. A semiconductor storage device comprising:
a first memory cell array configured to store user data and system information, which is used for a write operation and a read operation on the user data;
a plurality of first bit lines electrically connected to memory cells of the first memory cell array;
a first sense amplifier circuit connected to the first bit lines and including a first latch circuit configured to store first system information which are read from the first memory cell array and a second latch circuit configured to store second system information which are read from the first memory cell array;
a second memory cell array configured to store the user data and the system information;
a plurality of second bit lines electrically connected to memory cells of the second memory cell array;
a second sense amplifier circuit connected to the second bit lines and including a third latch circuit configured to store third system information which are read from the second memory cell array and a fourth latch circuit configured to store fourth system information which are read from the second memory cell array; and
a control circuit configured to:

execute in parallel and during a first time period, a first process of reading the first system information from the first memory cell array using even-numbered first bit lines and storing the first system information in the first latch circuit and a second process of reading the third system information from the second memory cell array using odd-numbered second bit lines and storing the third system information in the third latch circuit, and execute in parallel and during a second time period that follows the first time period, a third process of reading the second system information from the first memory cell array using odd-numbered first bit lines and storing the second system information in the second latch circuit and a fourth process of reading the fourth system information from the second memory cell array using even-numbered second bit lines and storing the fourth system information in the fourth latch circuit.

16. The semiconductor storage device according to claim 15, wherein the system information is constructed from the first system information and the second system information if the first system information and the second system information has no error, and the system information is constructed from the third system information and the fourth system information if the first system information and the second system information has an error and the third system information and the fourth system information has no error.

17. The semiconductor storage device according to claim 16, wherein during a third time period that begins after the first process completes and ends after the third process completes, the control circuit checks the first system information and the second system information for an error, and if the error is present, during a fourth time period that follows the third time period, the control circuit checks the third system information and the fourth system information for an error.

18. The semiconductor storage device according to claim 16, wherein during a third time period that begins after the first process completes and ends after the third process completes, the first sense amplifier circuit checks the first system information and the second system information for an error, and if the error is present, during a fourth time period that follows the third time period, the second sense amplifier circuit checks the third system information and the fourth system information for an error.

19. The semiconductor storage device according to claim 15, wherein the system information stored in the first memory cell array is identical to the system information stored in the second memory cell array.

20. The semiconductor storage device according to claim 15, wherein each of the first, second, third, and fourth system information is made of two data portions that are identical.

* * * * *